(12) United States Patent
Kawaguchi

(10) Patent No.: US 9,614,072 B2
(45) Date of Patent: Apr. 4, 2017

(54) SEMICONDUCTOR DEVICE

(71) Applicant: KABUSHIKI KAISHA TOSHIBA, Tokyo (JP)

(72) Inventor: Yusuke Kawaguchi, Miura Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/819,049

(22) Filed: Aug. 5, 2015

(65) Prior Publication Data

US 2016/0268419 A1    Sep. 15, 2016

(30) Foreign Application Priority Data

Mar. 10, 2015  (JP) .................. 2015-047417

(51) Int. Cl.
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 29/78 | (2006.01) |
| H01L 29/08 | (2006.01) |
| H01L 29/10 | (2006.01) |
| H01L 29/06 | (2006.01) |
| H01L 29/40 | (2006.01) |

(52) U.S. Cl.
CPC ...... H01L 29/7813 (2013.01); H01L 29/0696 (2013.01); H01L 29/086 (2013.01); H01L 29/1095 (2013.01); H01L 29/404 (2013.01); H01L 29/407 (2013.01)

(58) Field of Classification Search
CPC . H01L 29/402; H01L 29/407; H01L 29/7813; H01L 29/1095; H01L 29/0696; H01L 29/404; H01L 29/86
USPC ........................................ 257/330, 331, 340
See application file for complete search history.

(56) References Cited

U.S. PATENT DOCUMENTS

| 6,833,583 | B2 | 12/2004 | In't Zandt et al. |
| 8,889,511 | B2 * | 11/2014 | Yedinak .............. H01L 21/3065 |
| | | | 257/340 |
| 2005/0167749 | A1 * | 8/2005 | Disney ................ H01L 29/0696 |
| | | | 257/341 |

(Continued)

FOREIGN PATENT DOCUMENTS

JP    2014067753 A    4/2014

*Primary Examiner* — Thien F Tran
(74) *Attorney, Agent, or Firm* — Patterson & Sheridan, LLP

(57) ABSTRACT

A semiconductor device includes a first semiconductor region of a first conductivity type, a first electrode, a second electrode, a third electrode, a first insulation region, a second insulation region, a second semiconductor region of a second conductivity type, a third semiconductor region of the first conductivity type, a fourth semiconductor region of the second conductivity type, and a fourth electrode. The second electrode includes first portions and a second portion. The second portion extends in a first direction. The first portions extend in a direction away from the second portion. The second portion is between the first portions and the first electrode in a second direction. The fourth semiconductor region is positioned between adjacent first electrode portions in the first direction.

19 Claims, 17 Drawing Sheets

(56) References Cited

U.S. PATENT DOCUMENTS

| | | | |
|---|---|---|---|
| 2011/0169103 A1* | 7/2011 | Darwish | H03K 17/687 257/409 |
| 2013/0062688 A1* | 3/2013 | Kobayashi | H01L 29/407 257/330 |
| 2013/0248994 A1 | 9/2013 | Ninomiya | |
| 2014/0084333 A1 | 3/2014 | Nakamura et al. | |

* cited by examiner

SEMICONDUCTOR DEVICE

CROSS-REFERENCE TO RELATED APPLICATION

This application is based upon and claims the benefit of priority from Japanese Patent Application No. 2015-047417, filed Mar. 10, 2015, the entire contents of which are incorporated herein by reference.

FIELD

Embodiments described herein relate generally to a semiconductor device.

BACKGROUND

A semiconductor device such as a metal oxide semiconductor field effect transistor (MOSFET) has a diode embedded therein in some cases. While the MOSFET is in an off state, for example, a current flows in a forward direction of the embedded diode. When a reverse voltage is applied to the diode, electrons accumulated in the diode are discharged to a drain electrode, and holes are discharged to a source electrode. The state in which previously accumulated charge carriers are discharged from the diode is referred to as a reverse recovery state. In the reverse recovery state, a current flows due to the carriers being discharged. When a density of a current flowing is high in the semiconductor device, a breakdown of the semiconductor device may occur in some cases.

DESCRIPTION OF THE DRAWINGS

FIGS. 7A and 7B to FIGS. 12A and 12B are cross-sectional views which show a manufacturing process of the semiconductor device according to a first embodiment.

DETAILED DESCRIPTION

Figure 1:
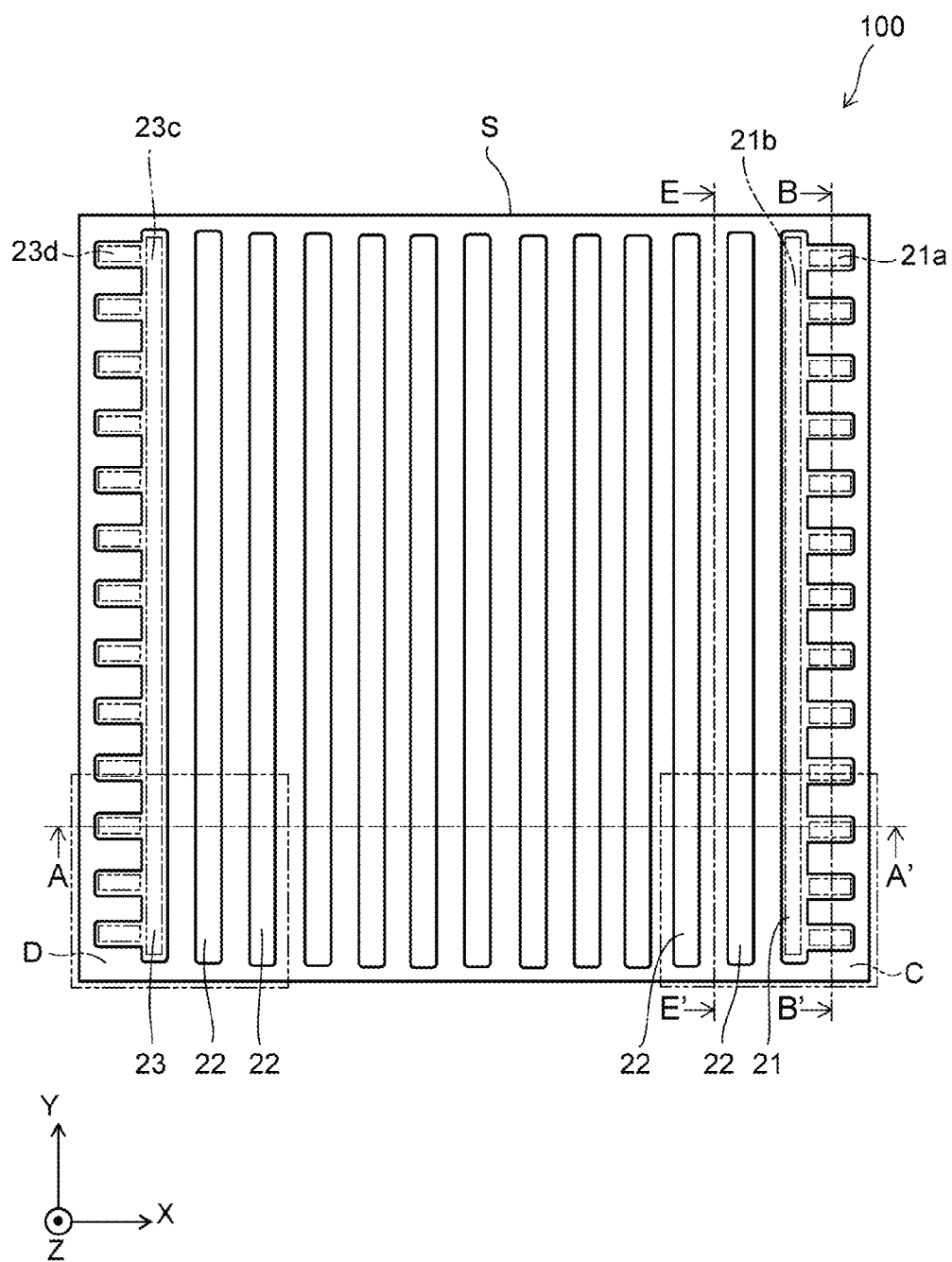
FIG. 1 is a plan view which shows a semiconductor device according to a first embodiment.

Embodiments provide a semiconductor device which may suppress a breakdown of a semiconductor device in a reverse recovery state.

In general, according to one embodiment, a semiconductor device, includes a first semiconductor region of a first conductivity type, a first electrode, a second electrode, a third electrode, a first insulation portion (region), a second insulation portion (region), a second semiconductor region of a second conductivity type, a third semiconductor region of the first conductivity type, a fourth semiconductor region of the second conductivity type, and a fourth electrode. The first electrode extends in a first direction. The second electrode is provided spaced from the first electrode. The second electrode includes a first portion and a second portion. The first portion extends in a second direction intersecting with the first direction. A plurality of first portions are spaced from each other along the first direction. The second portion extends in the first direction. The second portion is provided between the plurality of first portions and the first electrode in the second direction. The third electrode is provided spaced from the first electrode and the second electrode. The first insulation region is provided between the first semiconductor region and the first electrode and between the first semiconductor region and the third electrode. The second insulation region is provided between the first semiconductor region and the second electrode. The second semiconductor region is provided on the first semiconductor region. The second semiconductor region faces the second electrode through the second insulation region. The third semiconductor region is selectively provided on the second semiconductor region. The fourth semiconductor region is provided on the first semiconductor region. The fourth semiconductor region is between adjacent first portions of the second electrode in the first direction. The fourth electrode is provided on the third semiconductor region. The fourth electrode is electrically connected to the second semiconductor region, the third semiconductor region, the fourth semiconductor region, the first electrode, and the second electrode.

Hereinafter, example embodiments will be described by reference to drawings.

The drawings are schematic and/or conceptual, such that a relationship between a thickness and a width of each portion, and a size ratio between portions are not necessarily the same as those in an actual device. In addition, when showing the same portion, different dimensions or ratios may be depicted in the drawings in some cases. The same elements are denoted by the same reference numerals in the specification and in each drawing, and a detailed description of repeated or common element may be omitted.

An XYZ orthogonal coordinate system is used for a description of each embodiment. Two directions which are substantially parallel to a surface of the semiconductor layer S and orthogonal to each other are set to be an X direction (second direction) and a Y direction (first direction), and a direction orthogonal to both of these X and Y directions is set to be a Z direction.

In a following description, a notation of $n^+$, $n^-$, $p^+$, p, and $p^-$ shows a relative level of the impurity concentration for each conductivity type. That is, $n^+$ shows a relatively higher n-type impurity concentration than $n^-$. In addition, $p^+$ shows a relatively higher p-type impurity concentration than p, and $p^-$ shows a relatively lower p-type impurity concentration than p.

In the embodiments described below, each embodiment may also be implemented by inverting a p-type and an n-type for each semiconductor region.

(First Embodiment)
A semiconductor device 100 according to a first embodiment will be described with reference to FIGS. 1 to 6.

FIG. 1 is a plan view which shows the semiconductor device 100 according to a first embodiment.

Figure 2:
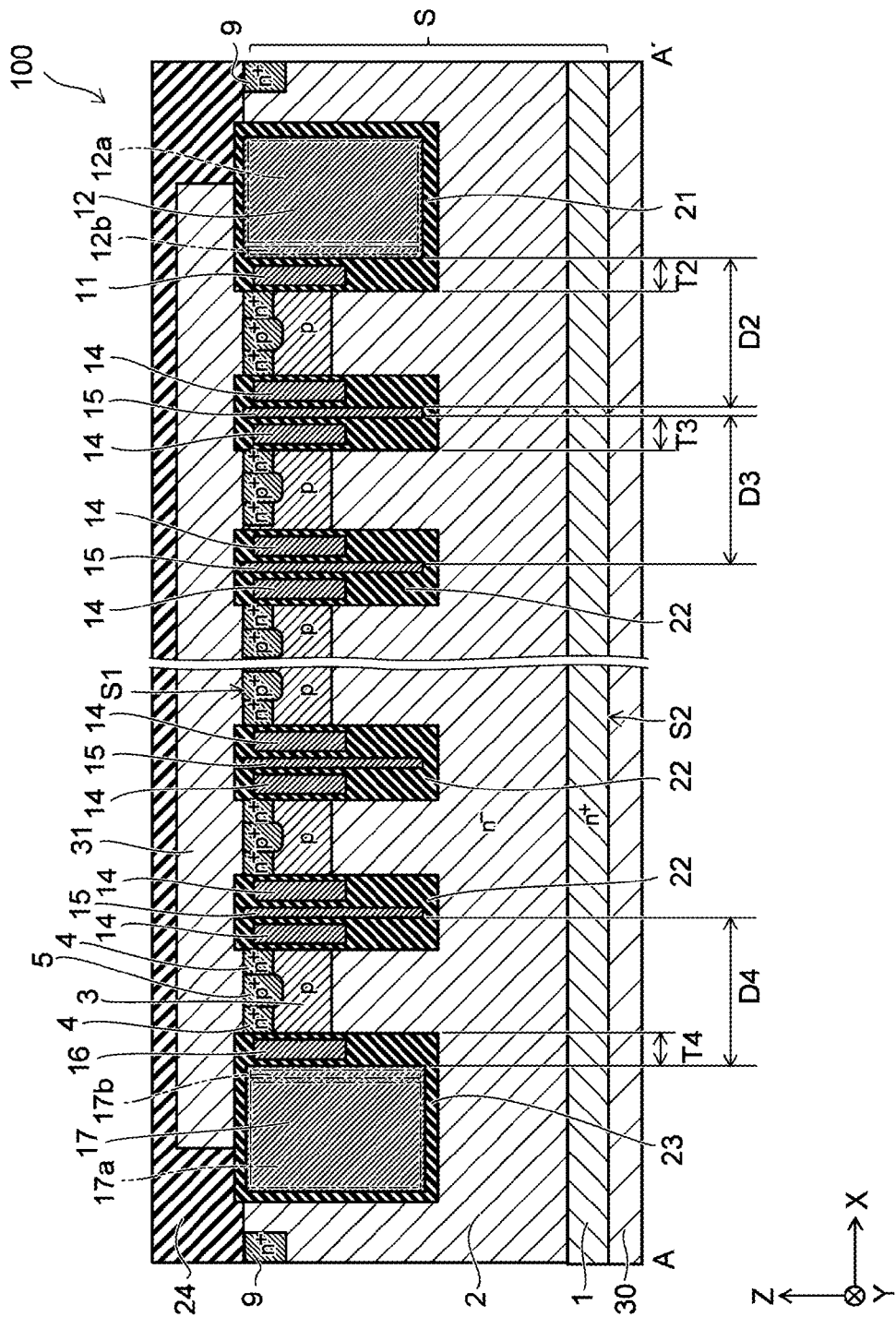
FIG. 2 is a cross-sectional view of the semiconductor device according to a first embodiment taken along line A-A' of FIG. 1.

FIG. 2 is a cross-sectional view taken along line A-A' of FIG. 1.

Figure 3:
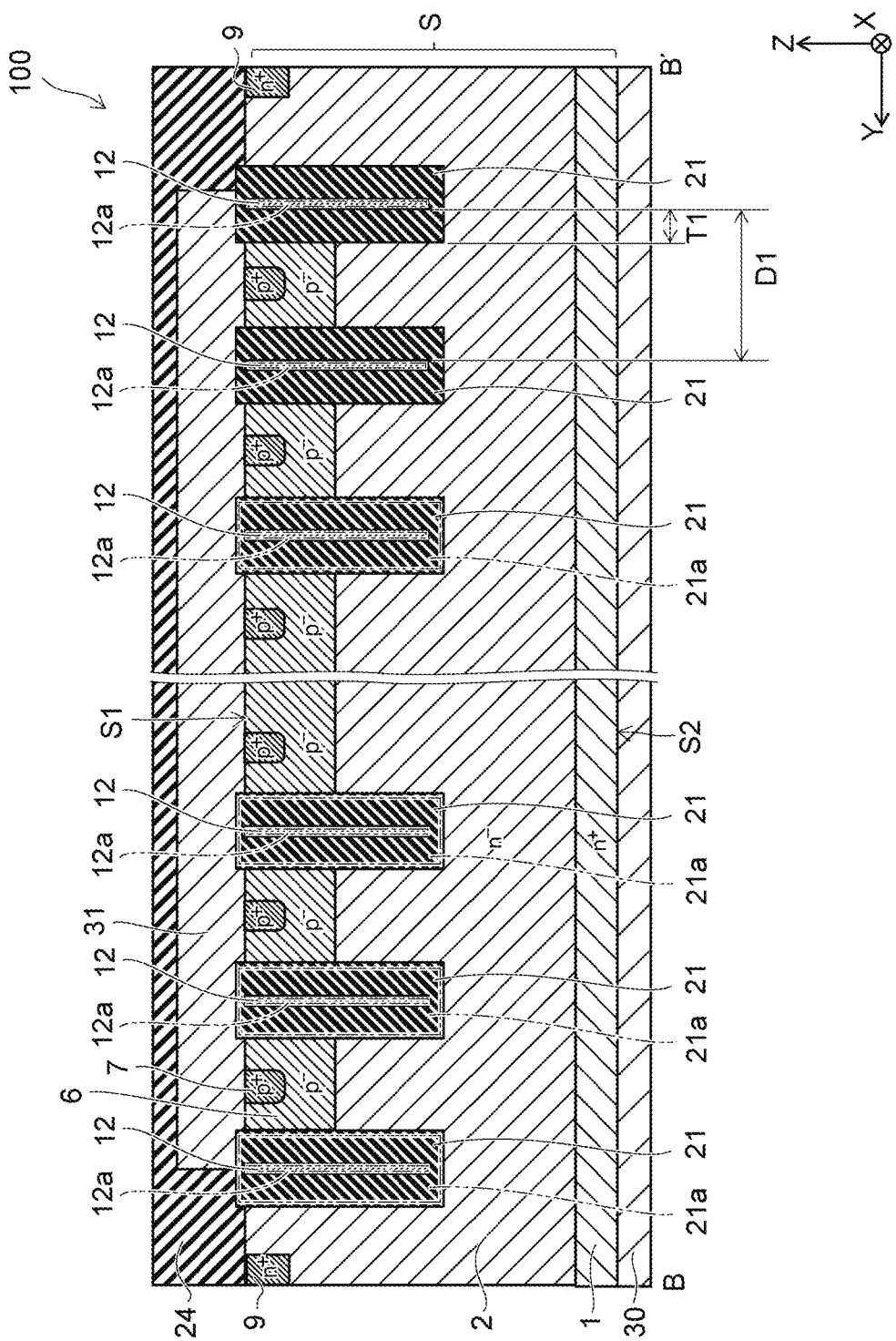
FIG. 3 is a cross-sectional view of the semiconductor device according to a first embodiment taken along line B-B' of FIG. 1.

FIG. 3 is a cross-sectional view taken along line B-B' of FIG. 1.

Figure 4:
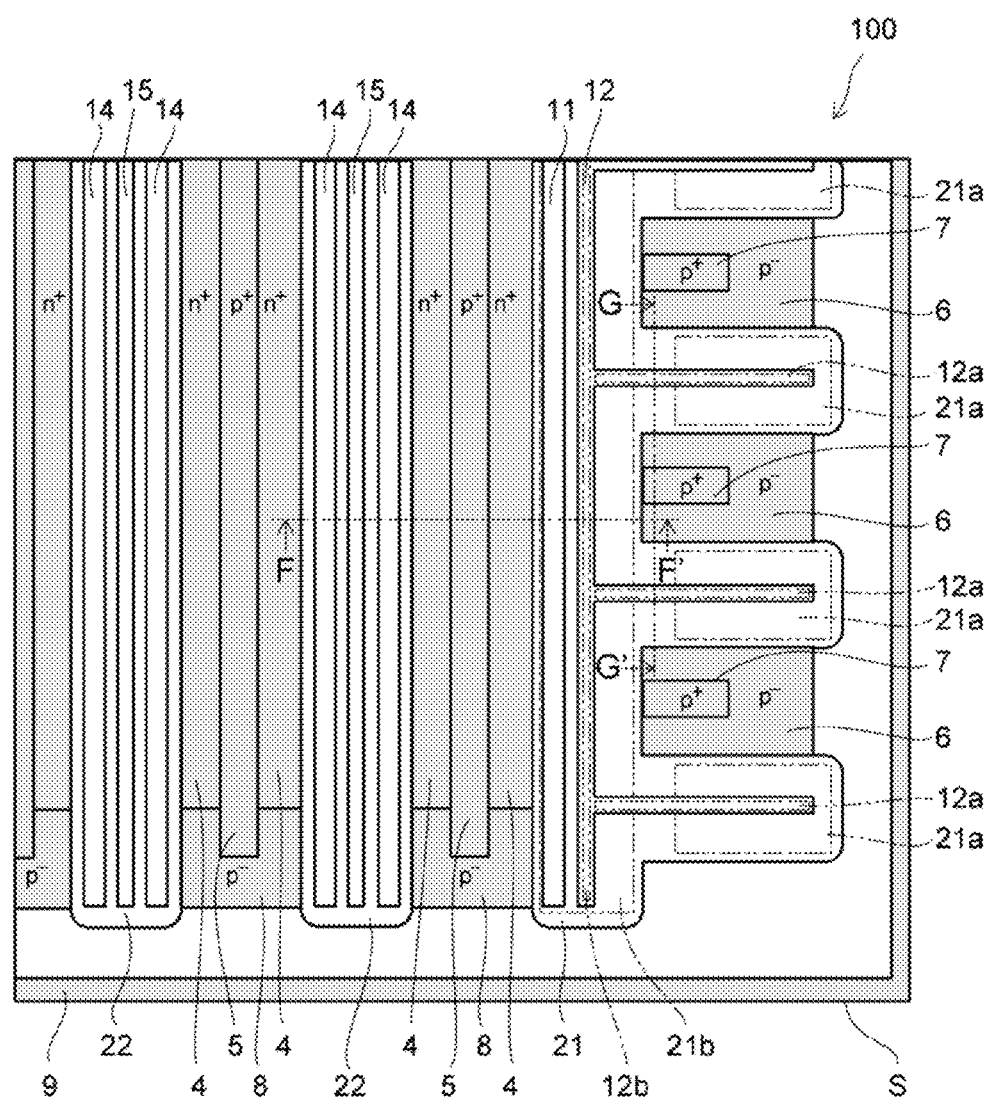
FIG. 4 is an enlarged plan view of a portion C of FIG. 1.
Figure 4:
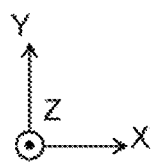

FIG. 4 is an enlarged plan view of a C portion of FIG. 1.

Figure 5:
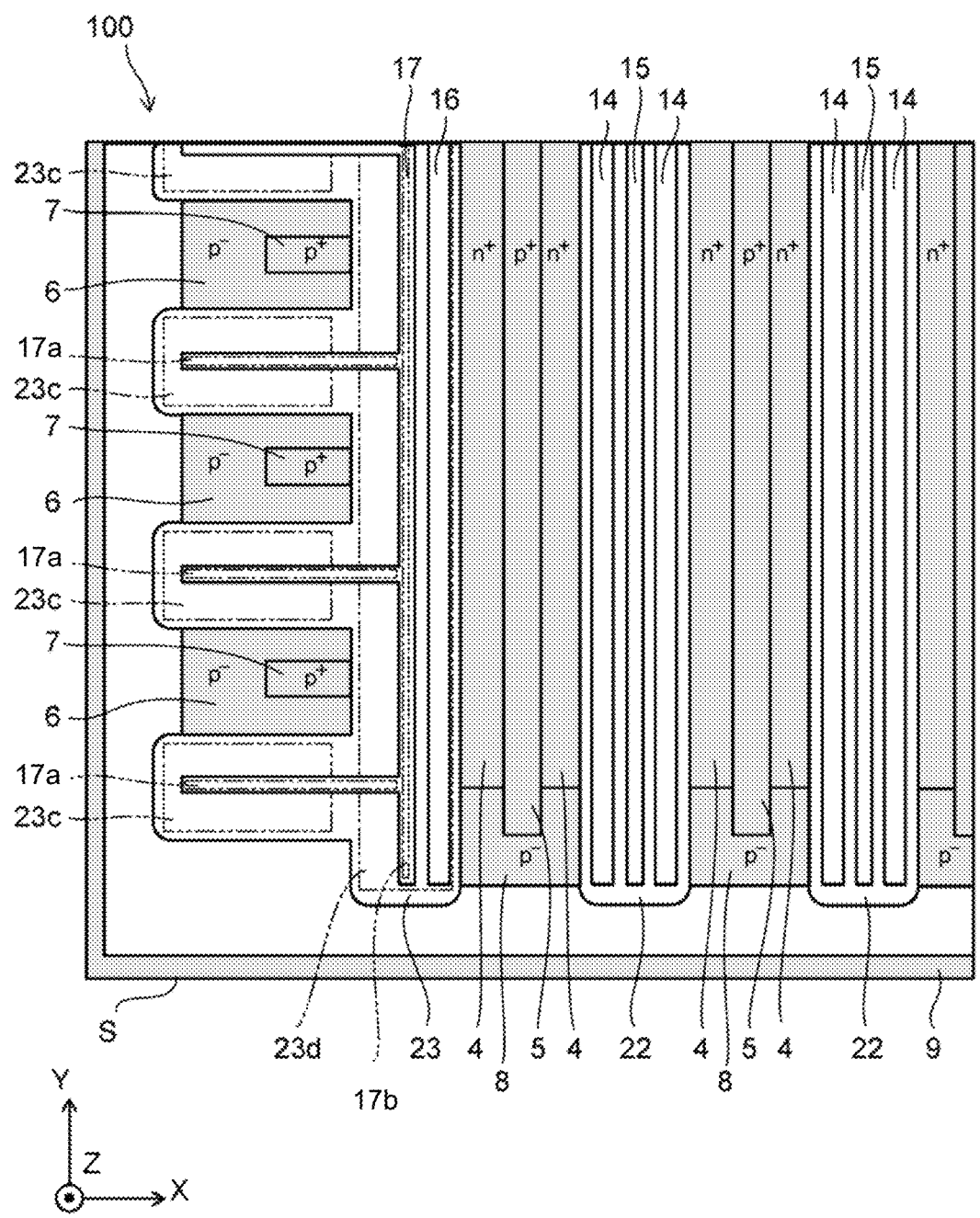
FIG. 5 is an enlarged plan view of a portion D of FIG. 1.

FIG. 5 is an enlarged plan view of a D portion of FIG. 1.

Figure 6:
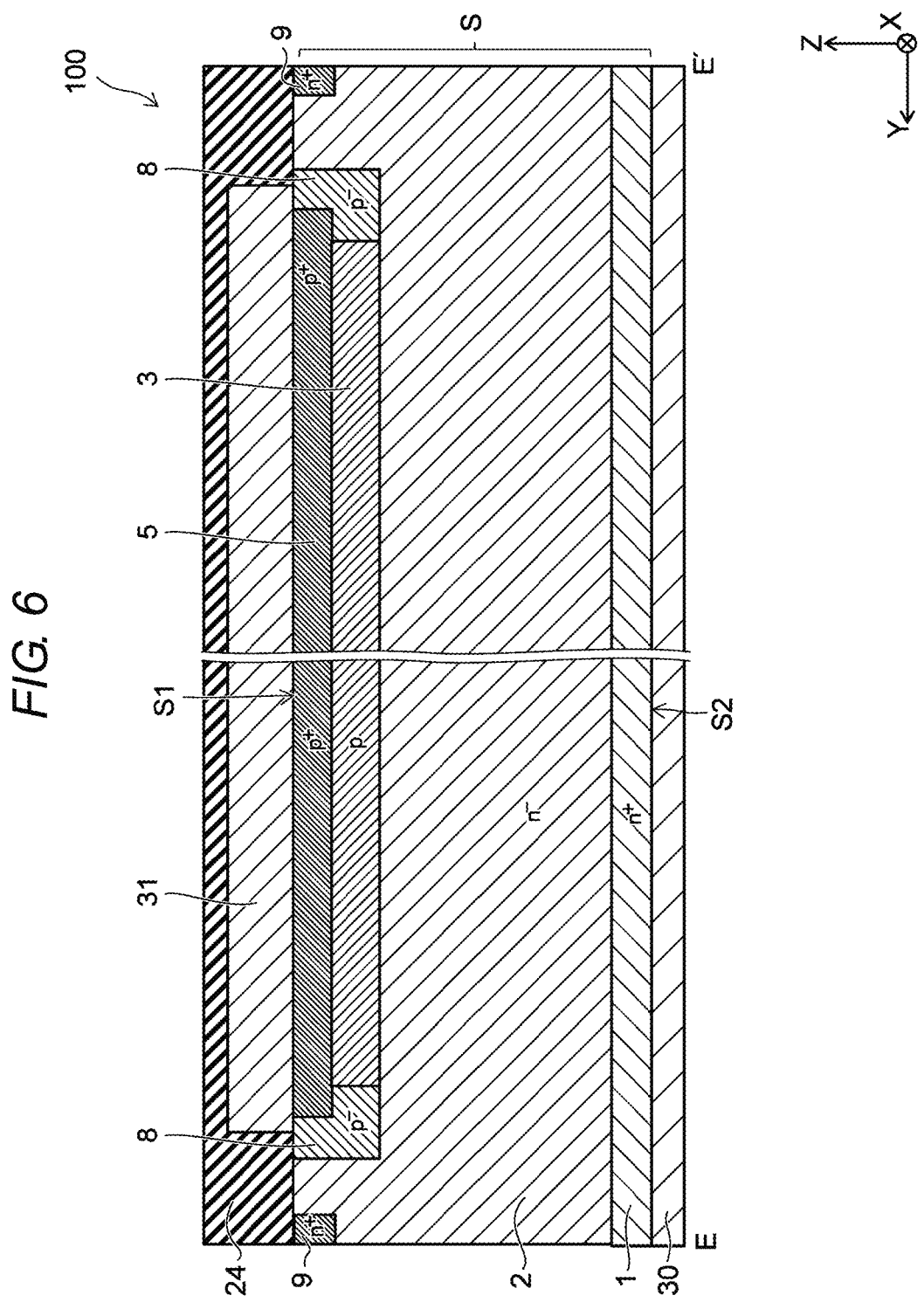
FIG. 6 is a cross-sectional view of the semiconductor device according to a first embodiment taken along line E-E' of FIG. 1.

FIG. 6 is a cross-sectional view taken along line E-E' of FIG. 1.

Only a first insulation portion 21, a second insulation portion 22, and a third insulation portion 23 which are provided in a semiconductor layer S are shown, and the other components are omitted in FIG. 1 for purposes of explanation.

An insulation layer 24, a source electrode 31, a portion of the first insulation portion 21, and a portion of the second insulation portion 22 are omitted in FIG. 4 for purposes of explanation.

The insulation layer 24, the source electrode 31, a portion of the second insulation portion 22, and a portion of the third insulation portion 23 are omitted in FIG. 5 for purposes of explanation.

The semiconductor device 100 according to the first embodiment is, for example, a MOSFET.

The semiconductor device 100 according to the first embodiment includes an $n^+$-type drain region 1, a semiconductor region 2 (first semiconductor region) of an $n^-$-type (first conductivity type), a base region 3 (second semiconductor region) of a p-type (second conductivity type), an $n^+$-type source region 4 (third semiconductor region), a $p^+$-type contact region 5 (seventh semiconductor region), a $p^-$-type semiconductor region 6 (fourth semiconductor region), a $p^+$-type semiconductor region 7 (eighth semiconductor region), a $p^-$-type semiconductor region 8 (fifth semiconductor region), an $n^+$-type semiconductor region 9 (sixth semiconductor region), a gate electrode 11, a field plate electrode 12 (second electrode), a gate electrode 14 (third electrode), a field plate electrode 15 (first electrode), a gate electrode 16, a field plate electrode 17, the first insulation portion 21, the second insulation portion 22, the third insulation portion 23, a drain electrode 30, and a source electrode 31 (fourth electrode).

As shown in FIG. 1, the semiconductor device 100 includes the first insulation portion 21, a plurality of the second insulation portions 22, and the third insulation portion 23 provided in the semiconductor layer S. The first insulation portion 21, the plurality of second insulation portions 22, and the third insulation portion 23 are spaced from each other in an X direction.

The first insulation portion 21 includes a plurality of first insulation portions 21a and a second insulation portion 21b.

The third insulation portion 23 includes a plurality of third insulation portions 23d and a fourth insulation portion 23c.

A plurality of the first insulation portions 21a and a plurality of the third insulation portions 23d are provided spaced from each other in a Y direction, each of the first insulation portions 21a and the third insulation portions 23d extends in the X direction. The second insulation portion 21b and the fourth insulation portion 23c extend in the Y direction.

In the X direction, a plurality of the second insulation portions 22 are provided between the first insulation portion 21 and the third insulation portion 23, and each of the second insulation portions 22 extends in the Y direction.

As shown in FIG. 2, the semiconductor layer S has a front surface S1 and a rear surface S2. The source electrode 31 is provided on a side of the front surface S1 (front surface side) of the semiconductor layer S, and the drain electrode 30 is provided on a side of the rear surface S2 (back surface side) of the semiconductor layer S.

The $n^+$-type drain region 1 is provided in the semiconductor layer S on the back surface side at the rear surface S2. The $n^+$-type drain region 1 is electrically connected to the drain electrode 30. The $n^-$-type semiconductor region 2 is provided on the $n^+$-type drain region 1.

The p-type base region 3 is selectively provided on the $n^-$-type semiconductor region 2. A plurality of the p-type base regions 3 are provided spaced from each other in the X direction, and each of the p-type base regions 3 extends in the Y direction parallel with the gate electrode 11. In addition, each of the p-type base regions 3 is provided between the first insulation portion 21 and a second insulation portion 22, between adjacent second insulation portions 22, or between a second insulation portion 22 and the third insulation portion 23.

As shown in FIGS. 2 and 4, the $n^+$-type source region 4 is selectively provided on the p-type base region 3. A plurality of the $n^+$-type source regions 4 are provided on each of the p-type base regions 3, and each of the $n^+$-type source regions 4 extends in the Y direction.

As shown in FIGS. 4 and 5, the $p^+$-type contact region 5 is selectively provided on the p-type base region 3. The $p^+$-type contact region 5 is provided between adjacent $n^+$-type source regions 4 on each of the p-type base regions 3. Each of the $p^+$-type contact regions 5 extends in the Y direction.

The gate electrode 11 and the field plate (FP) electrode 12 are provided spaced from each other in the X direction.

The gate electrode 11 is provided between the FP electrode 12 and a portion of the $n^-$-type semiconductor region 2, the p-type base region 3, and a portion of the $n^+$-type source regions 4. The first insulation portion 21 is provided between the gate electrode 11 and the FP electrode 12 and the $n^-$-type semiconductor region 2, the p-type base region 3, and the $n^+$-type source regions 4.

As shown in FIGS. 2 to 4, the FP electrode 12 includes the first electrode portion 12a and the second electrode portion 12b. A plurality of the first electrode portions 12a are provided spaced from each other in the Y direction, and each of the first electrode portions 12a extends in the X direction. The second electrode portion 12b extends in the Y direction. The first electrode portion 12a is in contact with the second electrode portion 12b.

In some embodiments, the first electrode portion 12a and the second electrode portion 12b may be provided spaced from each other in the X direction. That is, a portion of the first insulation portion 21 may be provided between the first electrode portion 12a and the second electrode portion 12b.

The gate electrode 14 and the FP electrode 15 are provided spaced from each other in the X direction. The gate electrode 14 and the FP electrode 15 extend in the Y direction, and the FP electrode 15 is provided between adjacent gate electrodes 14 in the X direction. The second electrode portion 12b is positioned between the plurality of first electrode portions 12a and the gate electrode 14 and the FP electrode 15 in the X direction.

The second insulation portion 22 is provided between the gate electrode 14 and the FP electrode 15 and between the gate electrode 14 and the $n^-$-type semiconductor region 2, the p-type base region 3, and the $n^+$-type source region 4. The gate electrode 14 faces a portion of the $n^-$-type semiconductor region 2, the p-type base region 3, and a portion of the $n^+$-type source regions 4 through the second insulation portion 22 in the X direction. A portion of the FP electrode 15 faces a portion of the n⁻-type semiconductor region 2 through the second insulation portion 22 in the X direction—that is, some portion of the FP electrode 15 extends in Z direction beyond the gate electrode 14.

The gate electrode 16 and the FP electrode 17 are provided spaced from each other in the X direction.

The gate electrode 16 is provided between the FP electrode 17 and a portion of the n⁻-type semiconductor region 2, the p-type base region 3, and a portion of the n⁺-type source regions 4 in the X direction. The third insulation portion 23 is provided between of the gate electrode 16 and the FP electrode 17 and between the gate electrode 16 and each of the n⁻-type semiconductor region 2, the p-type base region 3, and the n⁺-type source regions 4.

As shown in FIGS. 2 and 5, the FP electrode 17 includes a third electrode portion 17a and a fourth electrode portion 17b. A plurality of the third electrode portions 17a are provided spaced from each other in the Y direction, and each of the third electrode portions 17a extends in the X direction. The fourth electrode portion 17b extends in the Y direction. The third electrode portion 17a is in contact with the fourth electrode portion 17b.

The gate electrodes 11, 14, and 16 are electrically connected to a gate electrode pad which is not specifically depicted. The FP electrodes 12, 15, and 17 are electrically connected to the source electrode 31.

Here, as shown in FIGS. 2 and 3, a distance between adjacent first electrode portions 12a in the Y direction is set as D1, a distance between FP electrode 12 and a nearest on of the FP electrodes 15 in the X direction is set as D2, a distance between adjacent FP electrodes 15 in the X direction is set as D3, and a distance between the FP electrode 17 and a nearest one of the FP electrodes 15 in the X direction is set as D4. Here, each of the FP electrodes (12, 15, and 17) is provided so that the distances D1 to D4 are equal to each other.

In addition, as shown in FIGS. 2 and 3, a thickness of the first insulation portion 21 between the FP electrode 12 and the n⁻-type semiconductor region 2 in the Y direction is set as T1, a thickness of the first insulation portion 21 between the FP electrode 12 and the n⁻-type semiconductor region 2 in the X direction toward a FP electrode 15 is set as T2, a thickness of the second insulation portion 22 between the FP electrode 15 and the n⁻-type semiconductor region 2 in the X direction is set as T3, and a thickness of the third insulation portion 23 between the FP electrode 17 and the n⁻-type semiconductor region 2 in the X direction toward a FP electrode 15 is set as T4. The first insulation portions (21, 22, and 23) and each of the FP electrodes (12, 15, and 17) are provided so that, for example, the thicknesses T1 to T4 are equal to each other.

The p⁻-type semiconductor region 6 is selectively provided on the n⁻-type semiconductor region 2. As shown in FIGS. 3 to 5, the p⁻-type semiconductor region 6 is provided between adjacent first electrode portions 12a in the Y direction and between adjacent third electrode portions 17a in the Y direction. The second insulation portion 21b is provided between the p-type base region 3 and the p⁻-type semiconductor region 6 in the X direction.

As shown in FIGS. 4 and 5, a portion of the second electrode portion 12b and a portion of the fourth electrode portion 17b are provided between the p⁻-type semiconductor region 6 and the p-type base region 3 in the X direction. In addition, when viewed from a Z direction, the first electrode portion 12a and the p⁻-type semiconductor region 6, and the third electrode portion 17a and the p⁻-type semiconductor region 6 are provided to intersect with each other in the Y direction.

In other words, with regard to the p⁻-type semiconductor region 6 provided between adjacent first electrode portions 12a in the Y direction, a position of at least one portion of the p⁻-type semiconductor region 6 in the X direction is equal to a position of at least one portion of the first electrode portion 12a in the X direction. That is, along the X direction at least a portion of the first electrode portion 12a overlaps with p⁻-type semiconductor region 6. In addition, a position of the p⁻-type semiconductor region 6 in the Y direction is between positions of two adjacent first electrode portions 12a in the Y direction.

In the same manner, with regard to the p⁻-type semiconductor region 6 provided between adjacent third electrode portions 17a in the Y direction, a position of at least one portion of the p⁻-type semiconductor region 6 in the X direction is equal to a position of at least one portion of the third electrode portion 17a in the X direction. In addition, a position of the p⁻-type semiconductor region 6 in the Y direction is between positions of two adjacent third electrode portions 17a in the Y direction.

The p⁺-type semiconductor region 7 is selectively provided on the p⁻-type semiconductor region 6. A plurality of the p⁺-type semiconductor regions 7 are provided spaced from each other in the Y direction. The p⁺-type semiconductor regions 7 are electrically connected to the source electrode 31.

As shown in FIGS. 4 to 6, the p⁻-type semiconductor region 8 may be provided on the n⁻-type semiconductor region 2. A plurality of the p⁻-type semiconductor regions 8 are provided spaced from each other in the X direction. The plurality of p⁻-type semiconductor regions 8 is similarly provided at each end of the p⁺-type contact region 5 along the Y direction.

As shown in FIGS. 2 to 6, the n⁺-type semiconductor region 9 may be further provided on the n⁻-type semiconductor region 2. The n⁺-type semiconductor region 9 is provided on an outer periphery of the semiconductor device 100 so as to surround the p-type base region 3, the n⁺-type source region 4, the p⁺-type contact region 5, the p⁻-type semiconductor region 6, the p⁺-type semiconductor region 7, and the p⁻-type semiconductor region 8.

At least one portion of the p-type base region 3, at least one portion of the n⁺-type source region 4, and at least one portion of the p⁺-type contact region 5 are provided between the p⁻-type semiconductor regions 8 in the Y direction as shown in, for example, FIG. 6.

A p-type impurity concentration of the p⁻-type semiconductor region 6 is equal to a p-type impurity concentration of the p⁻-type semiconductor region 8. Alternatively, the p-type impurity concentration of the p⁻-type semiconductor region 6 may be equal to the p-type impurity concentration of the p-type base region 3.

The source electrode 31 is provided on the front surface S1. An insulation layer is provided between each gate electrode element and the source electrode 31, and each gate electrode element is electrically insulated from the source electrode 31. The source electrode 31 is electrically connected to the n⁺-type source region 4, the p⁺-type contact region 5, and the p⁺-type semiconductor region 7. The p-type base region 3 is electrically connected to the source electrode through the p⁺-type contact region 5. The p⁻-type semiconductor region 6 is electrically connected to the source electrode 31 through the p⁺-type semiconductor region 7. In addition, the source electrode 31 is electrically connected to the FP electrodes 12, 15, and 17.

With a positive voltage with respect to the source electrode 31 applied to the drain electrode 30, a voltage equal to or greater than a threshold can be applied to the gate electrode, and thereby a channel (inversion layer) will be formed in the p-type base region 3 and a MOSFET is turned on (placed in a conducting state).

Next, an example of a method of manufacturing the semiconductor device 100 according to a first embodiment will be described referring to FIGS. 7A to 12B.

FIGS. 7A to 12B are cross-sectional views which show a manufacture process of the semiconductor device 100 according to a first embodiment.

Drawings on the left side in FIGS. 7A to 12B are sectional views which show a manufacture process at a position corresponding to a F-F' line of FIG. 4, and drawings on the right side of FIGS. 7A to 12B are cross-sectional views which show a manufacture process at a position corresponding to a G-G' line of FIG. 4.

Here, an n$^+$-type semiconductor substrate (hereinafter, referred to as a substrate) 1a is prepared. Subsequently, silicon is epitaxially grown while the n-type impurity is doped therein, thereby forming the n$^-$-type semiconductor layer 2a on the substrate 1a. As the n-type impurity, it is possible to use phosphorus or arsenic.

Figure 7A:
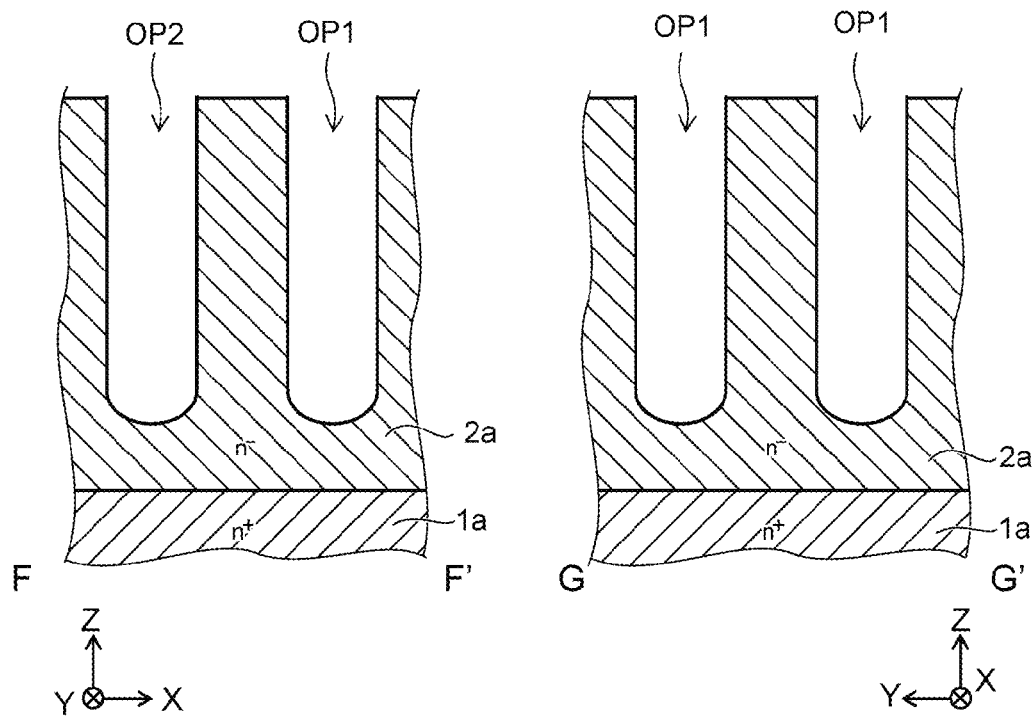

Then, as shown in FIG. 7A, openings OP1 and OP2 are formed in the n$^-$-type semiconductor layer 2a. A portion of the opening OP1 extends in the Y direction, and another portion of the opening OP1 extends in the X direction. The opening OP2 extends in the Y direction. Here, the openings OP1 and OP2 are formed using a reactive ion etching (RIE) method.

Figure 7B:
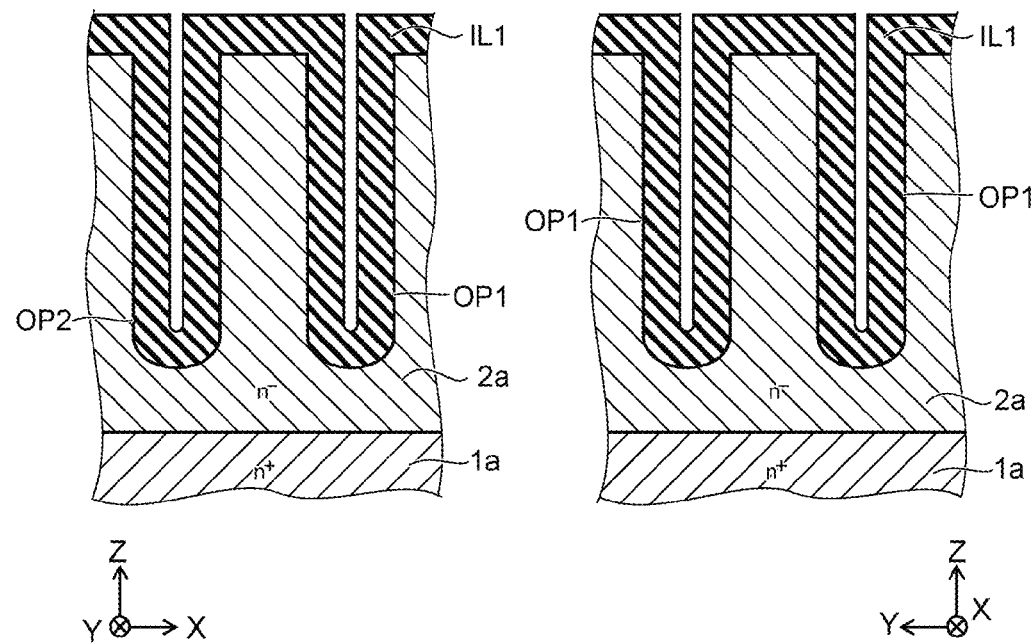

Then, as shown in FIG. 7B, an insulation layer IL1 is formed on an inner wall of the opening OP1, an inner wall of the opening OP2, and an upper surface of the n$^-$-type semiconductor layer 2a. As a material of the insulation layer IL1, it is possible to use silicon oxide. Here, the insulation layer IL1 is formed using a thermal oxidization method or a chemical vapor deposition (CVD) method.

Then, a conductive layer is formed to fill the remaining portions of the openings OP1 and OP2. The conductive layer contains, for example, poly-silicon, and here is formed by using the CVD method. An n-type impurity or a p-type impurity may be doped into the poly-silicon. As the p-type impurity, it is possible to use boron.

Figure 8A:
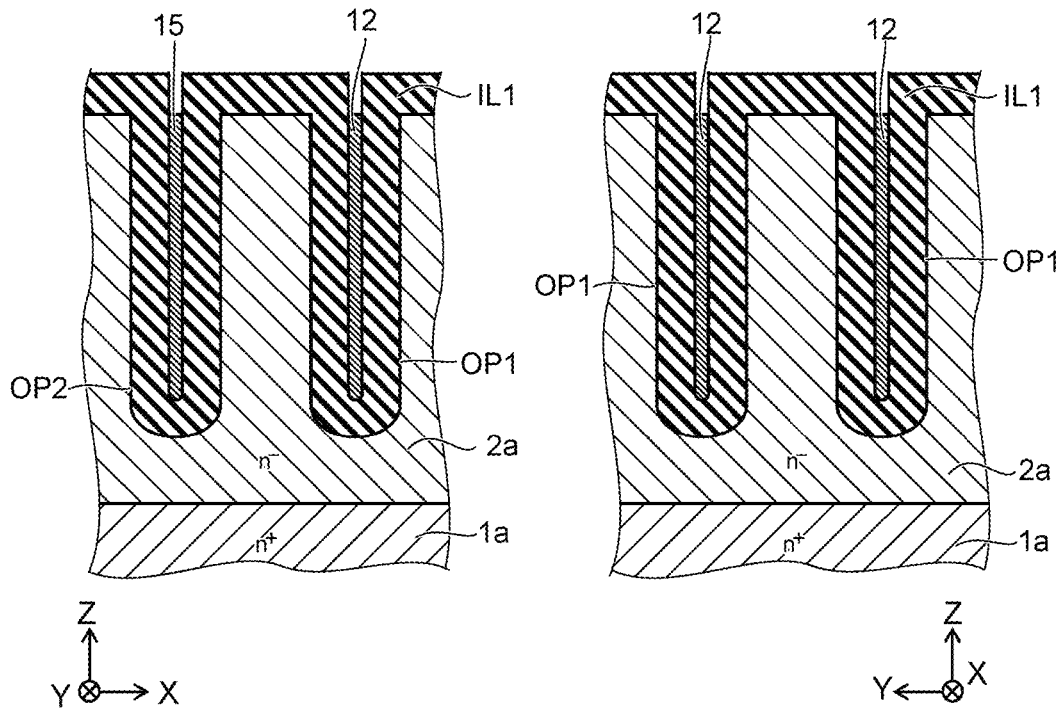

Then, as shown in FIG. 8A, a portion of the conductive layer is removed by a chemical dry etching (CDE) method. The conductive layer is etched until a position of an upper end of the conductive layer is equal to a position of an upper end of the n$^-$-type semiconductor layer 2a, for example.

By this process, the FP electrode 12 is formed in the opening OP1, and the FP electrode 15 is formed in the opening OP2. The FP electrode 12 formed in a portion of the opening OP1 extending in the Y direction is linked to the FP electrode 12 formed in a portion of the opening OP1 extending in the X direction.

Figure 8B:
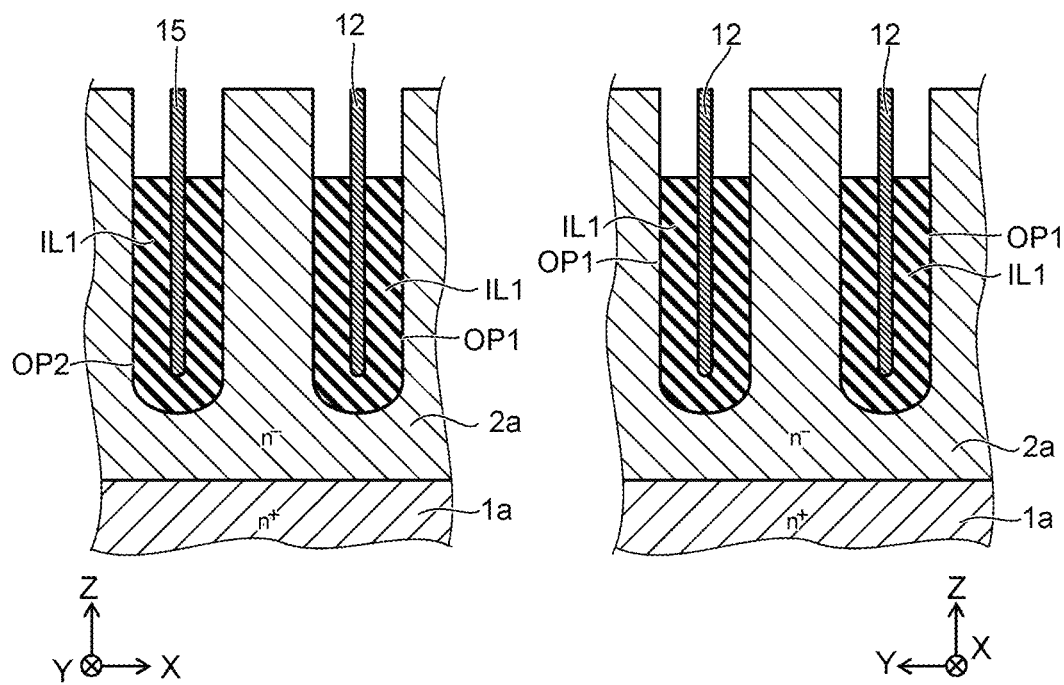

Next, as shown in FIG. 8B, a portion of the insulation layer IL1 is selectively removed. By this process, a side wall of the FP electrode 12, a side wall of the FP electrode 15, a portion of the inner wall of the opening OP1, and a portion of the inner wall of the opening OP2 are exposed. The portion of the insulation layer IL1 may be removed, for example, by a wet etching method in which an etching solution including hydrogen fluoride (HF) is used.

Figure 9A:
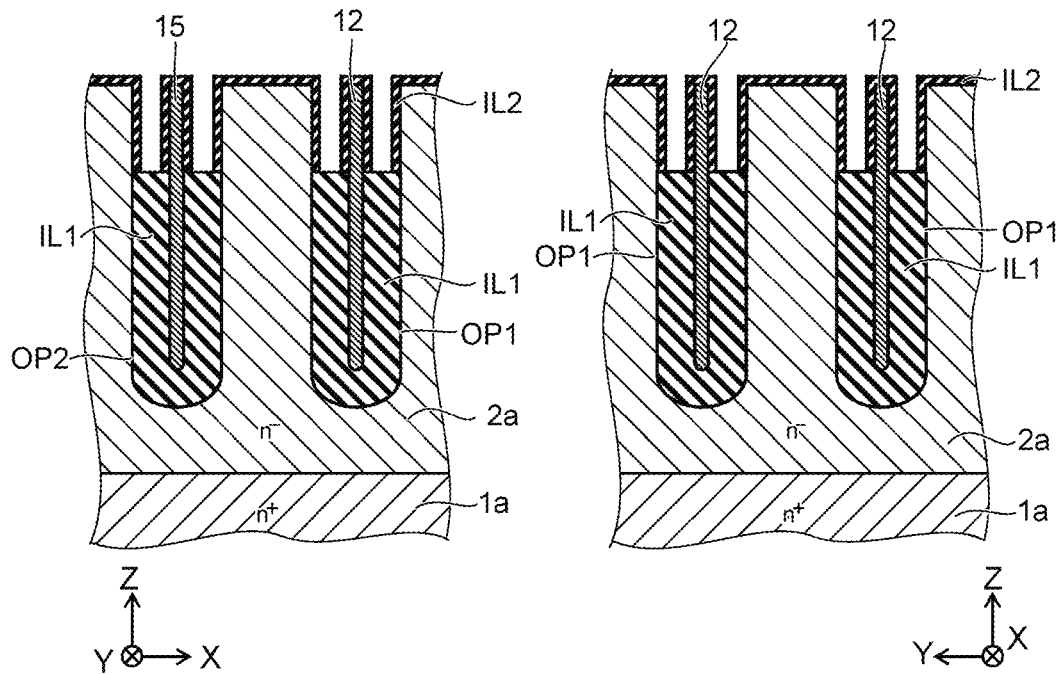

Then, as shown in FIG. 9A, an insulation layer IL2 is formed by using a thermal oxidization method. The insulation layer IL2 is formed on an exposed portion of the FP electrodes 12 and 15, an exposed portion of the inner wall of the openings OP1 and OP2, and the upper surface of the n$^-$-type semiconductor layer 2a.

Then, a mask M1, which covers a portion of the insulation layer IL2, is formed. The mask M1 covers a portion of the insulation layer IL2 that is formed in the opening OP1. As a material of the mask M1, silicon oxide may be used.

Figure 9B:
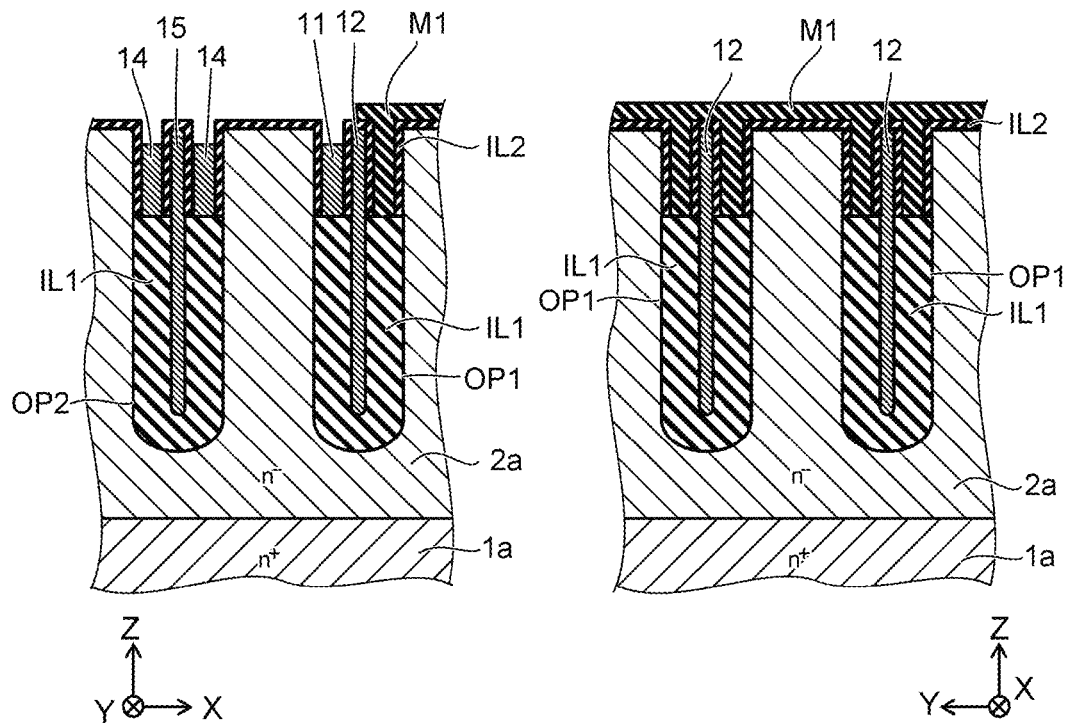

Then, a conductive layer is formed. The conductive layer is formed of, for example, poly-silicon formed by using a CVD method. Subsequently, as shown in FIG. 9B, a portion of this conductive layer formed in the opening OP1 and other portions of the conductive layer formed outside of the opening OP2 are removed by, for example, a CDE method. By this process, the gate electrodes 11 and 14 are formed.

Figure 10A:
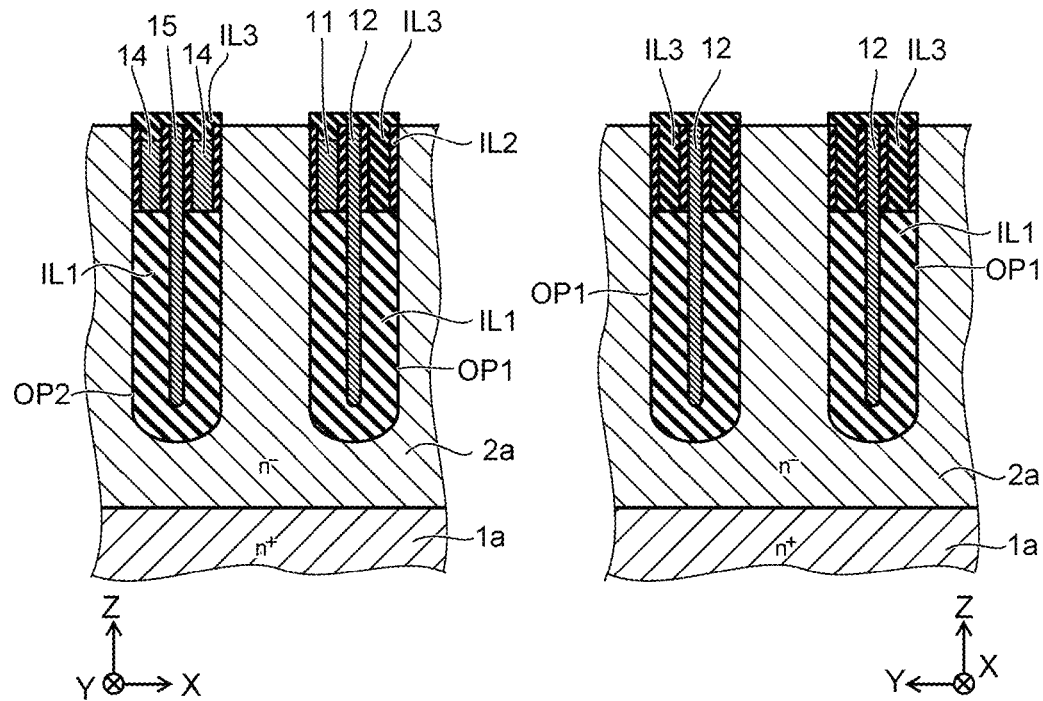

Then, an insulation layer IL3 is formed so as to cover the insulation layer IL2 and each gate electrode (11 and 14). The insulation layer IL3 contains, for example, silicon oxide, and is formed by a CVD method. Thereafter, a portion of the insulation layer IL3 is removed by using a RIE method, and thereby the upper surface of the n$^-$-type semiconductor layer 2a is exposed as shown in FIG. 10A.

By this process, the first insulation portion 21, the second insulation portion 22, and the third insulation portion 23 are formed. That is, each of the first insulation portion 21, the second insulation portion 22, and the third insulation portion 23 has a portion of the insulation layer IL1, a portion of the insulation layer IL2, and a portion of the insulation layer IL3.

Figure 10B:
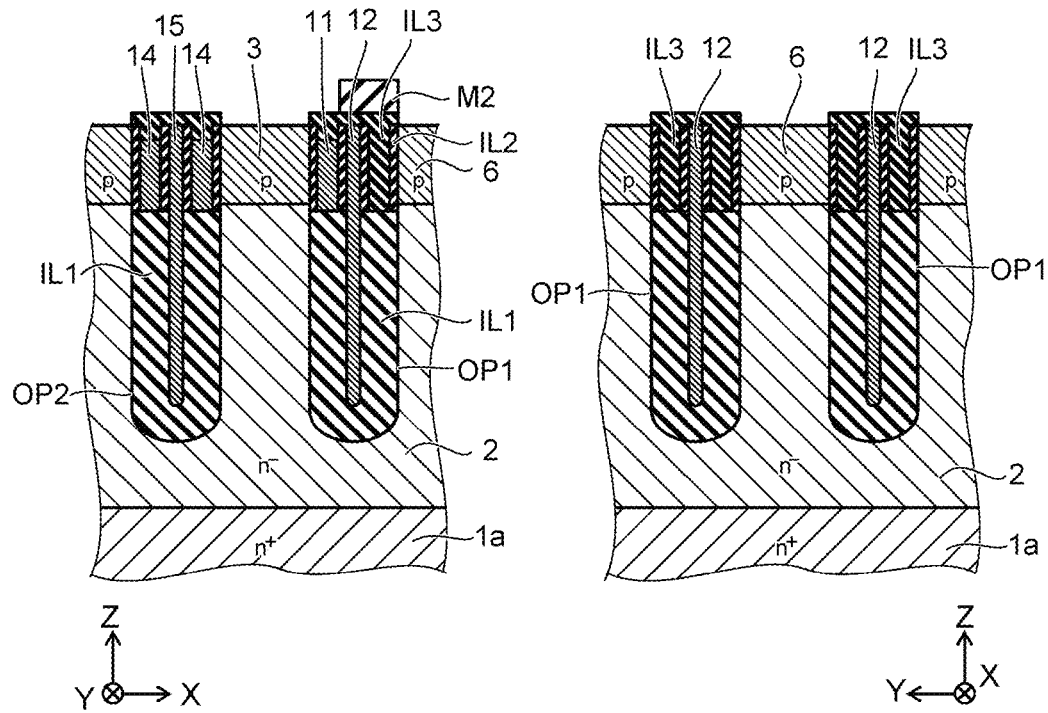

Then, a mask M2 is formed. Subsequently, as shown in FIG. 10B, a p-type impurity is ion-implanted into a portion of the n$^-$-type semiconductor layer 2a by using the mask M2, and thereby the p-type base region 3 and the p$^-$-type semiconductor region 6 are formed. In some embodiments, the p-type base region 3 and the p$^-$-type semiconductor region 6 may be formed by different processes. In the n$^-$-type semiconductor layer 2a, a region other than the p-type base region 3 and the p$^-$-type semiconductor region 6 corresponds to the n$^-$-type semiconductor region 2.

Figure 11A:
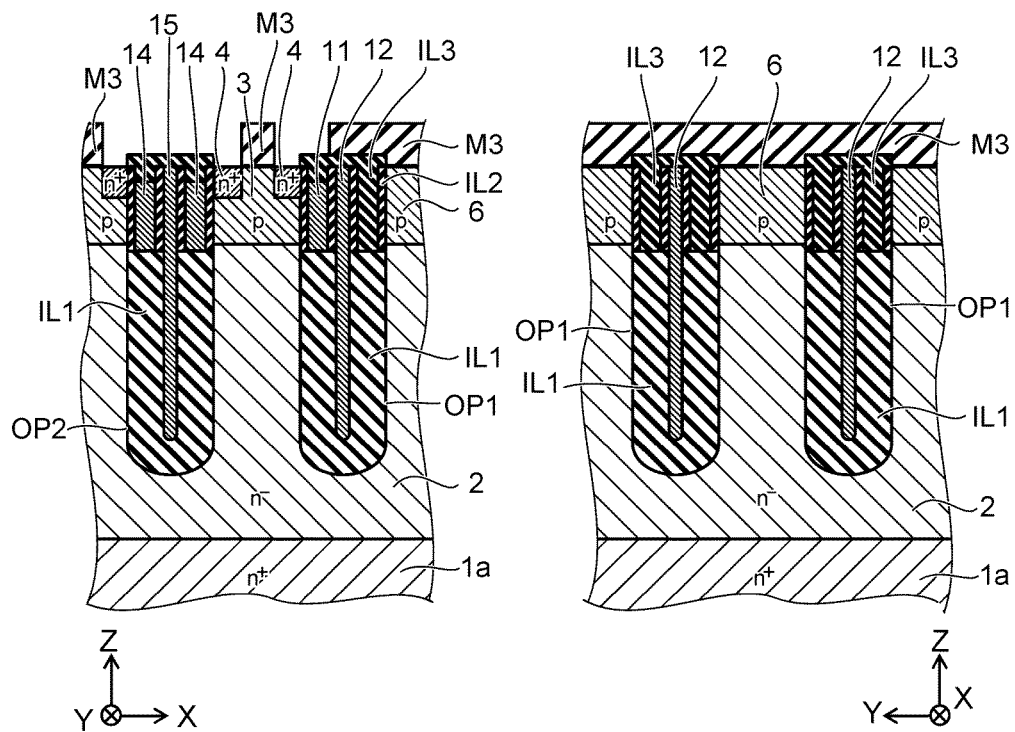

Then, a mask M3 which covers a portion of the upper surface of the n$^-$-type semiconductor layer 2a, a portion of an upper surface of the p-type base region 3, and the p$^-$-type semiconductor region 6 is formed. Subsequently, an n-type impurity is ion-implanted into a portion of the p-type base region 3 using the mask M3, and thereby the n$^+$-type source region 4 is formed as shown in FIG. 11A.

Figure 11B:
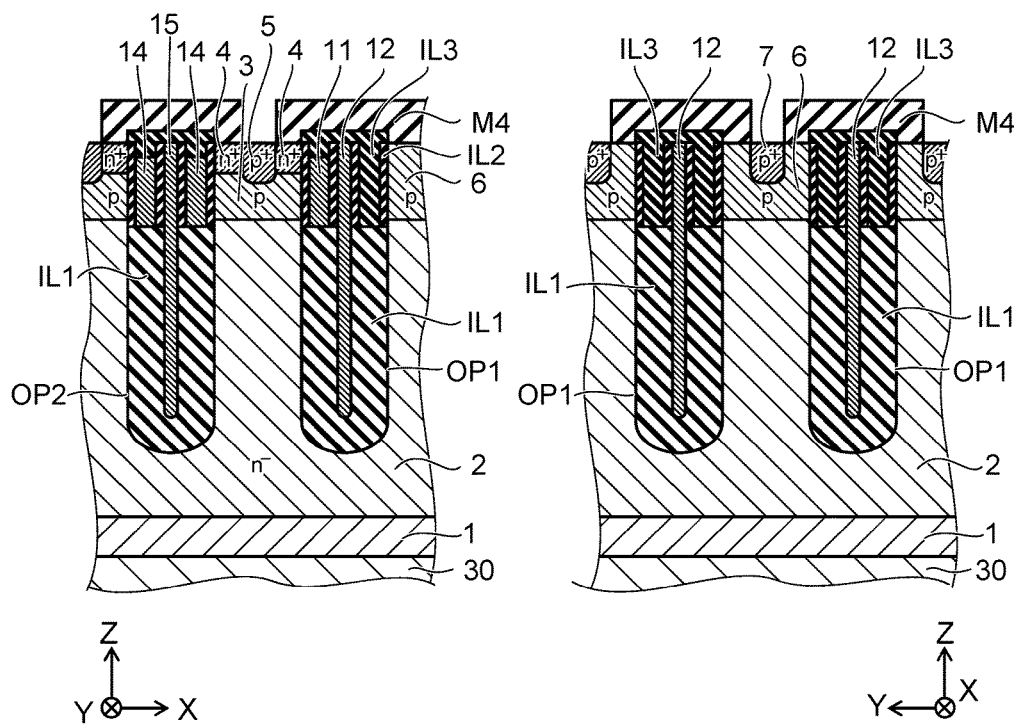

Then, a mask M4 which covers a portion of the upper surface of the n$^-$-type semiconductor layer 2a, a portion of the upper surface of the p-type base region 3, and a portion of the p$^-$-type semiconductor region 6 is formed. Subsequently, a p-type impurity is ion-implanted into a portion of the p-type base region 3 and a portion of the p$^-$-type semiconductor region 6 using the mask M4 as shown in FIG. 11B, and thereby the p$^+$-type contact region 5 and the p$^+$-type semiconductor region 7 are formed.

Figure 12A:
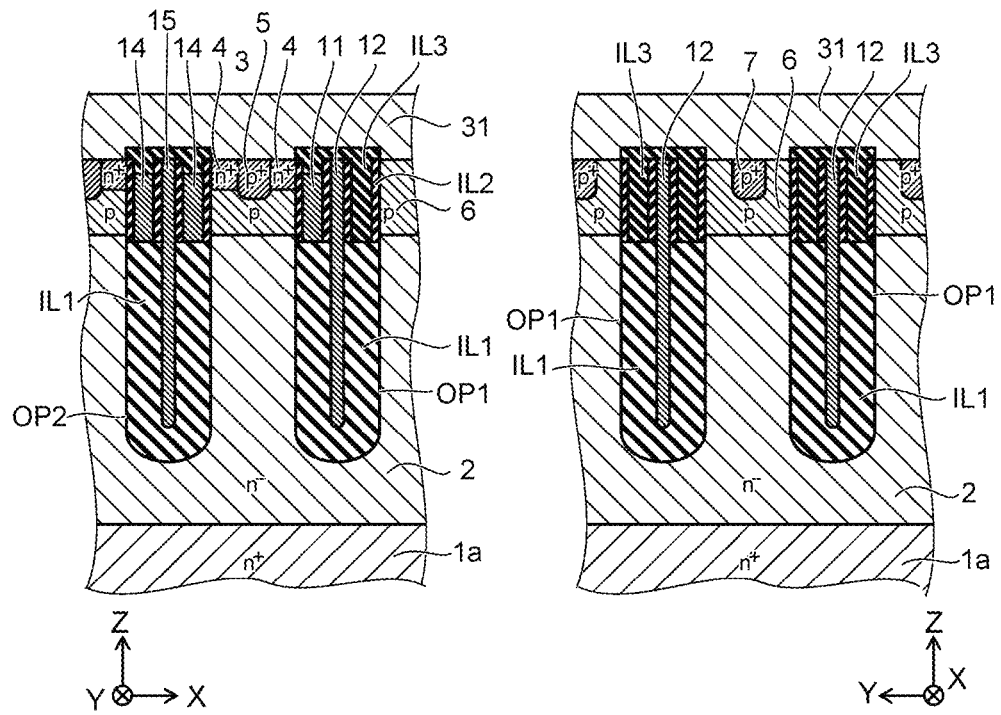

Then, a conductive layer which is formed on the n$^+$-type source region 4, the p$^+$-type contact region 5, p$^-$-type semiconductor region 6, and the p$^+$-type semiconductor region 7. The source electrode 31 is formed, as shown in FIG. 12A, by patterning this conductive layer.

Figure 12B:
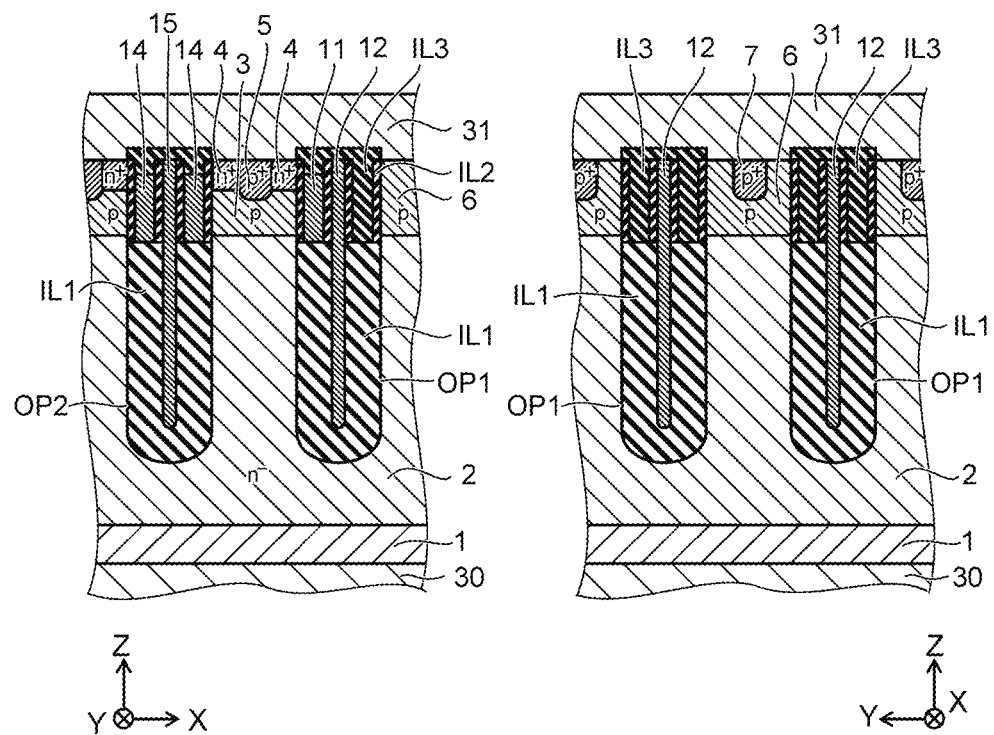

Then, a rear surface (back side) of the substrate 1a is polished until the substrate 1a has a predetermined thickness. By this process, the n$^+$-type drain region 1 can be obtained. Subsequently, as shown in FIG. 12B, the drain electrode 30 is formed on the polished rear surface of the substrate, and thereby the semiconductor device 100 is obtained.

Here, an operation and an effect of the first embodiment will be described.

According to the first embodiment, it is possible to reduce a possibility of having a breakdown of a semiconductor device in a reverse recovery state while a decrease in a breakdown voltage of the semiconductor device is also suppressed.

A reason for this will be described referring to a comparative example described below. A semiconductor device according to the comparative example does not include the p$^-$-type semiconductor region 6, the p$^+$-type semiconductor region 7, the first electrode portion 12a, and the third electrode portion 17a, unlike the semiconductor device according to the first embodiment.

When a MOSFET is in an off state (non-conducting state) and a positive voltage with respect to the source electrode 31 is applied to the drain electrode 30, with the source electrode 31 serving as an anode electrode, and the drain electrode 30 serving as a cathode electrode, a forward current flows between the p$^+$-type contact region 5 and the n$^+$-type drain region 1.

Then, when a positive voltage with respect to the source electrode 31 is applied to the drain electrode 30, carriers accumulated in the n$^-$-type semiconductor region 2 are discharged through any one of the drain electrode 30 and the source electrode 31. Specifically, an electron is discharged through the drain electrode 30, and a hole is discharged through the source electrode 31.

At this time, in a case of the semiconductor device according to the comparative example, while the n$^+$-type drain region 1 and the drain electrode 30 are formed over the entire surface under the n$^-$-type semiconductor region 2, the p$^+$-type contact region 5 is selectively formed only in a central portion (element region) of the semiconductor device above the n$^-$-type semiconductor region 2. Specifically, in a case of the semiconductor device according to a comparative example, the p$^+$-type contact region 5 is selectively formed to be between the first insulation portion 21 and the second insulation portion 22, between the second insulation portions 22, and between the second insulation portion 22 and the third insulation portion 23.

Therefore, a current density due to a discharge of holes will be higher than a current density due to a discharge of electrons. In particular, a p$^+$-type semiconductor region is not provided in an outer periphery portion (terminal region) of the semiconductor device surrounding the element region, and thus, holes are accumulated and the current density is likely to be increased.

In this regard, it may be considered to provide a p-type semiconductor region in the terminal region and thus to promote a discharge of the holes. However, adopting this arrangement will generally cause a breakdown voltage of the semiconductor device to be lowered when an FP electrode is provided in the semiconductor device.

Specifically, when a semiconductor device includes a FP electrode connected to a source electrode, a depletion layer will expand in the n$^-$-type semiconductor region which is a drift region due to an electric field generated by the FP electrode. The breakdown voltage is improved by the presence of the depletion layer, and as a result, it is possible to increase an n-type impurity concentration in the n$^-$-type semiconductor region.

By increasing the n-type impurity concentration in the n$^-$-type semiconductor region, on-resistance may be reduced; however, the depletion layer is less likely to expand from the p-type semiconductor region in contact with the n$^-$-type semiconductor region toward the drift region.

Accordingly, when the p-type semiconductor region is provided in an outer periphery portion of the semiconductor device according to the comparative example, with the MOSFET in an off state, the depletion layer will not be sufficiently expanded between the p-type semiconductor region and the n$^-$-type semiconductor region. For this reason, a device breakdown is more likely to occur at a portion in which the p-type semiconductor region is provided.

In contrast, in the first embodiment, the plurality of first electrode portions 12a extending in the X direction are provided in a region outside the region in which a plurality of gate electrodes extending in the Y direction are provided. Also, the p$^-$-type semiconductor region 6 and the p$^+$-type semiconductor region 7 are provided between these first electrode portions 12a. By adopting such a configuration the depletion layer may expand in the n$^-$-type semiconductor region 2 by an electric field generated by the first electrode portion 12a when the MOSFET is in an off state. Therefore, even when the p$^-$-type semiconductor region 6 and the p$^+$-type semiconductor region 7 are provided, it is possible to maintain a high breakdown voltage of the semiconductor device.

In the same manner, with respect to the third electrode portion 17a, a depletion layer expands in the n$^-$-type semiconductor region 2 by an electric field generated by the third electrode portion 17a to increase the breakdown voltage of the semiconductor device.

In addition, since a hole is efficiently discharged to the source electrode 31 through the p$^-$-type semiconductor region 6 in the reverse recovery state, a current density is kept low. As a result, according to the first embodiment, it is possible to reduce a possibility of having a breakdown of a semiconductor device in a reverse recovery state while maintaining a breakdown voltage of the semiconductor device.

The p$^-$-type semiconductor region 6 does not need to be positioned between the entire length of the first electrode portions 12a along the X direction, and may be positioned between only some portion of the length of the first electrode portions 12a when viewed from the Z direction. That is, a position of at least one portion of the p$^-$-type semiconductor region 6 aligns with a position of at least one portion of the first electrode portion 12a along the Y direction, and a position of the p$^-$-type semiconductor region 6 in the Y direction may be between positions of two adjacent first electrode portions 12a in the Y direction.

In the same manner, with respect to a relationship between the p$^-$-type semiconductor region 6 and the third electrode portion 17a, a position of at least one portion of the p$^-$-type semiconductor region 6 aligns with a position of at least one portion of the third electrode portion 17a in the Y direction, and a position of the p$^-$-type semiconductor region 6 in the Y direction may be between positions of two adjacent third electrode portions 17a in the Y direction.

In addition, at least one portion of the FP electrode 12 overlaps in the Y direction with the n$^-$-type semiconductor region 2 through the first insulation portion 21. Similarly, at least one portion of the FP electrode 17 overlaps in the Y direction with the n$^-$-type semiconductor region 2 through the first insulation portion 21. Thereby, a depletion layer is likely to expand in a region between the FP electrode 12 and the n$^-$-type semiconductor region 2. Therefore, it is possible to further reduce a possibility of having a breakdown of a semiconductor device in a region in which the p$^-$-type semiconductor region 6 is provided.

The p$^+$-type contact region 5 is provided on the p-type base region 3. The p$^+$-type semiconductor region 7 is provided on the p⁻-type semiconductor region 6. Thereby, a discharge of holes in a reverse recovery state is efficiently performed and the current density is not increased.

The p⁻-type semiconductor regions 8 are provided in at least one of a position between the first insulation portion 21 and the second insulation portion 22, a position between the second insulation portions 22, and a position between the second insulation portion 22 and the third insulation portion 23. The p-type base region 3 and the p⁺-type contact region 5 are provided between the p⁻-type semiconductor regions 8. It is possible to improve a breakdown voltage of a semiconductor device by providing the p⁻-type semiconductor regions 8.

Moreover, the n⁺-type semiconductor region 9 which surrounds the p-type base region 3, the n⁺-type source region 4, and the p⁻-type semiconductor region 6 is provided, and thereby it is possible to suppresses a depletion layer from extending from the p-type base region 3 or the p⁻-type semiconductor region 6 toward an outer periphery of the semiconductor device 100. When the depletion layer is suppressed in this manner, a terminal region in the semiconductor device 100 may be decreased in size (e.g., overall die area). Accordingly, it is possible to reduce an amount of accumulation of holes in the terminal region, and to reduce a current density in the reverse recovery state.

Modification Example of First Embodiment

Figure 13:
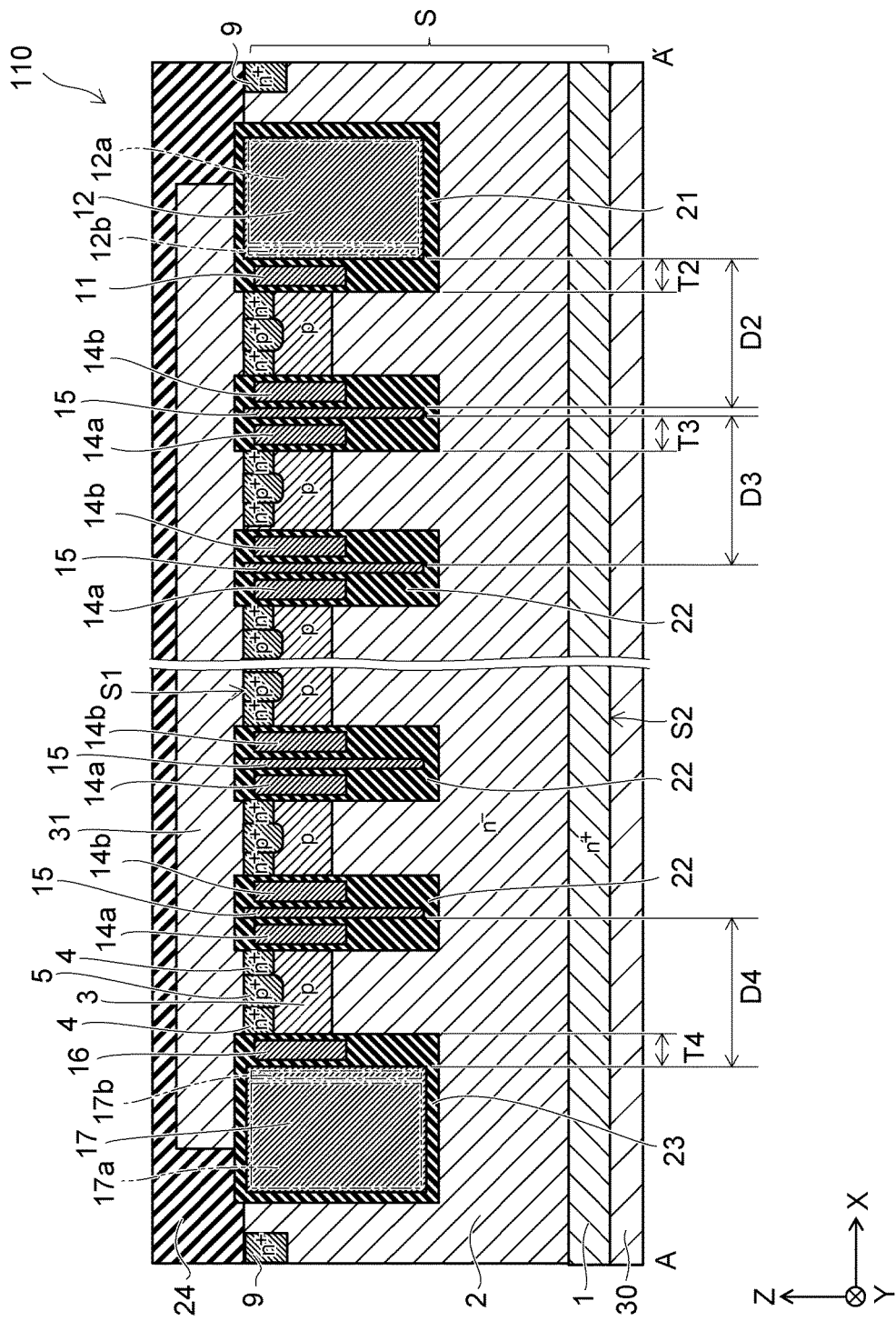
FIG. 13 is a cross-sectional view which shows a semiconductor device according to a modification example of the first embodiment.

FIG. 13 is a cross-sectional view which shows the semiconductor device 110 according to a modification example of the first embodiment.

A plan view of the semiconductor device 110 according to the modification example is the same as the plan view shown in FIG. 1. FIG. 13 is a cross-sectional view of the semiconductor device 110 at a position corresponding to an A-A' cross-section of FIG. 1.

The semiconductor device 110 is different from the semiconductor device 100 in that potentials of electrodes surrounded by the second insulation portion 22 differ from the semiconductor device 100. Elements other than these electrodes (14a/14b) in the semiconductor device 110 are substantially the same as in the semiconductor device 100.

As shown in FIG. 13, the semiconductor device 110 includes an electrode 14a, an electrode 14b, and an FP electrode 15, which are surrounded by the second insulation portion 22. The electrode 14a and the electrode 14b may have the same structure as that of the gate electrode(s) 14 in the semiconductor device 100. Here, the electrode 14a is electrically connected to the source electrode 31. The electrode 14b is an electrode functioning as a gate electrode and thus is not electrically connected to the source electrode, but rather has a potential which varies with an intended gate potential of the semiconductor device 110. The FP electrode 15 is electrically connected to the source electrode 31 in the same manner as in the semiconductor device 100.

Even with this modification, it is possible to reduce a possibility of having a breakdown of a semiconductor device in a reverse recovery state while a breakdown voltage is suppressed not to be lowered in the same manner as in the semiconductor device 100.

In addition, it is possible to decrease the total number of gate electrodes in the semiconductor device 110 according to this modification example, as compared to the semiconductor device 100. Therefore, compared to the semiconductor device 100, it is possible to reduce an overall gate capacitance value and thus to improve a switching speed.

(Second Embodiment)

A semiconductor device 200 according to a second embodiment will be described with reference to FIGS. 14 to 17.

Figure 14:
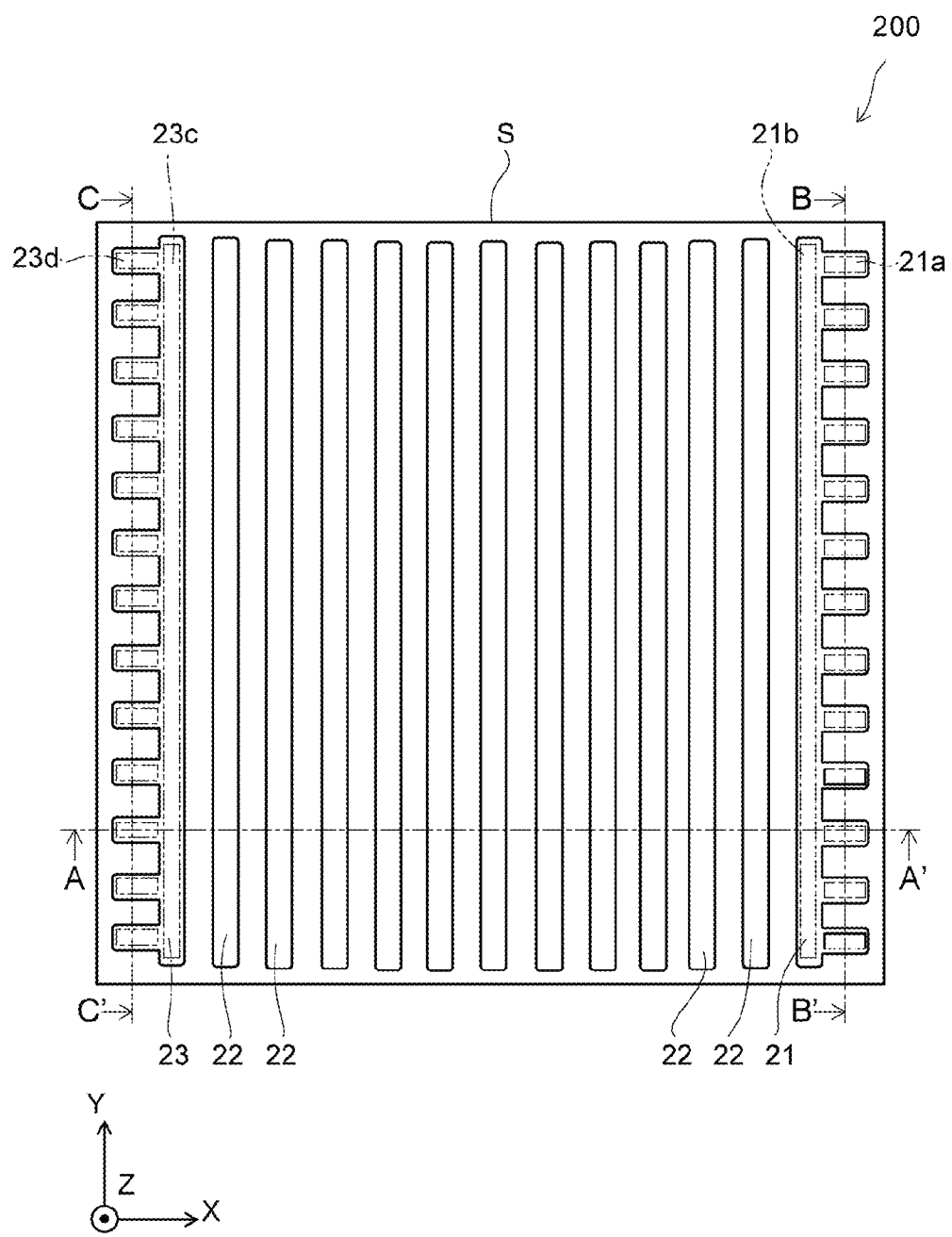
FIG. 14 is a plan view which shows a semiconductor device according to a second embodiment.

FIG. 14 is a plan view which shows the semiconductor device 200 according to the second embodiment.

Figure 15:
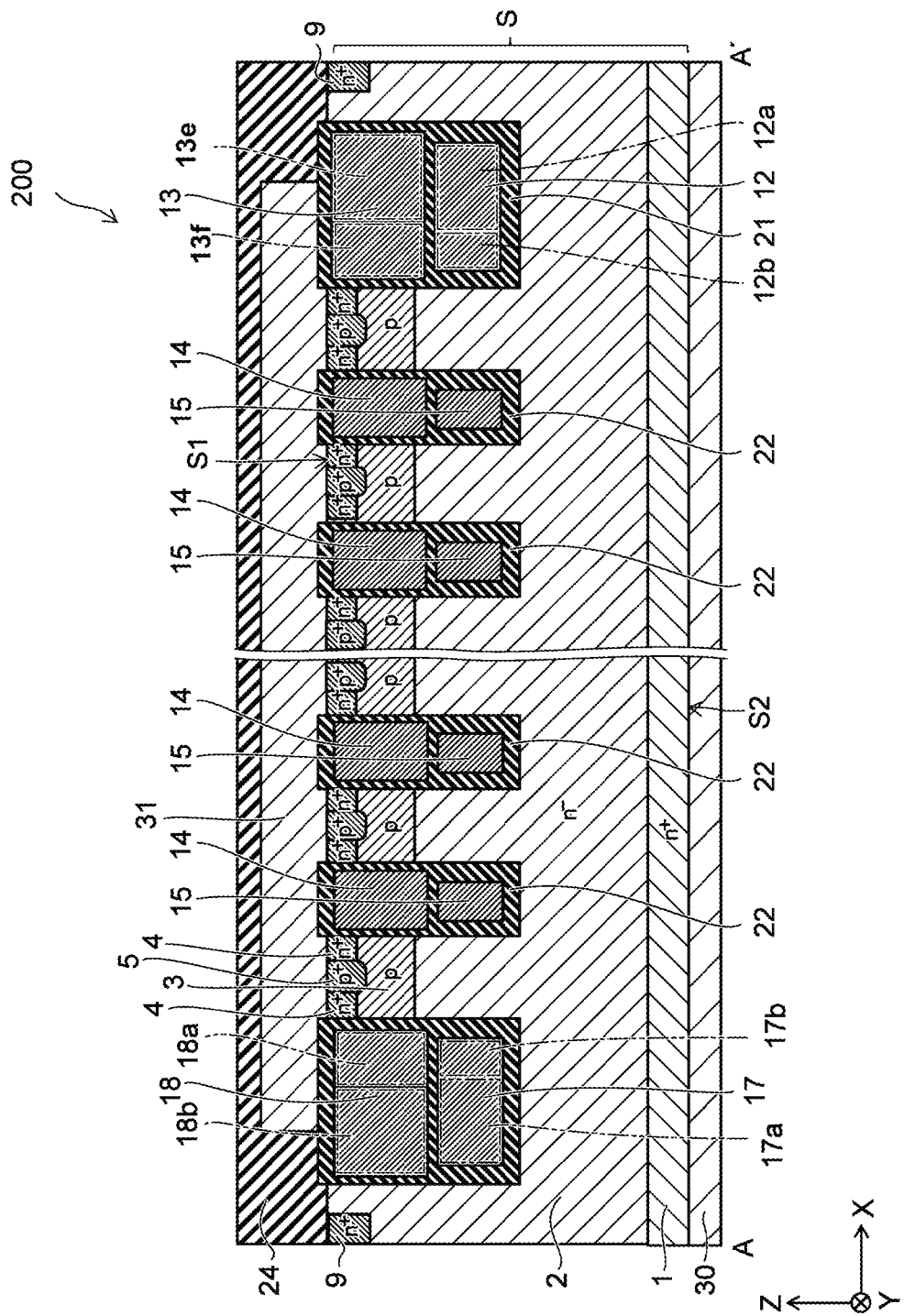
FIG. 15 is a cross-sectional view of the semiconductor device according to a second embodiment taken along line A-A' of FIG. 14.
Figure 16:
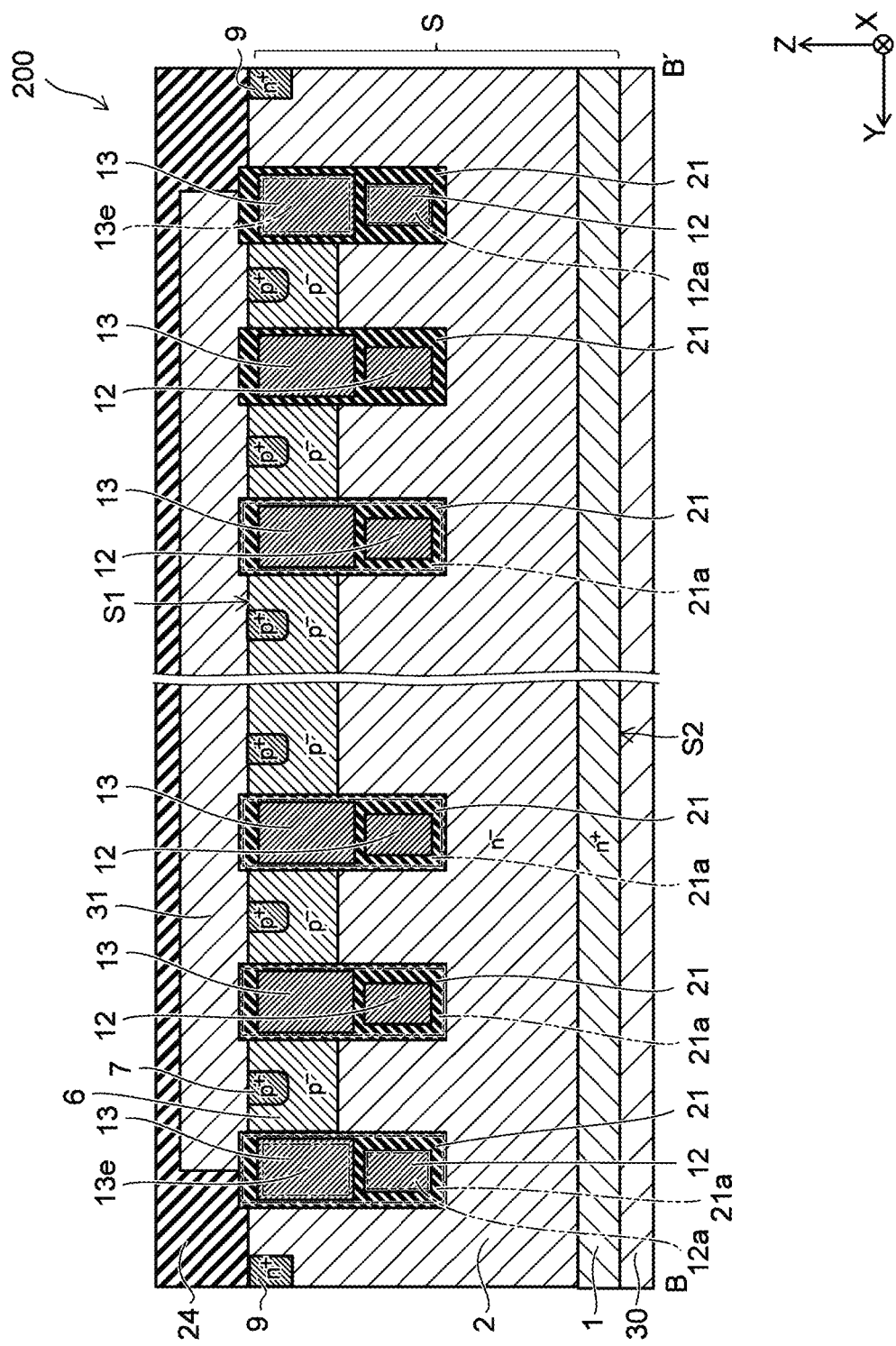
FIG. 16 is a cross-sectional view of the semiconductor device according to a second embodiment taken along line B-B' of FIG. 14.
Figure 17:
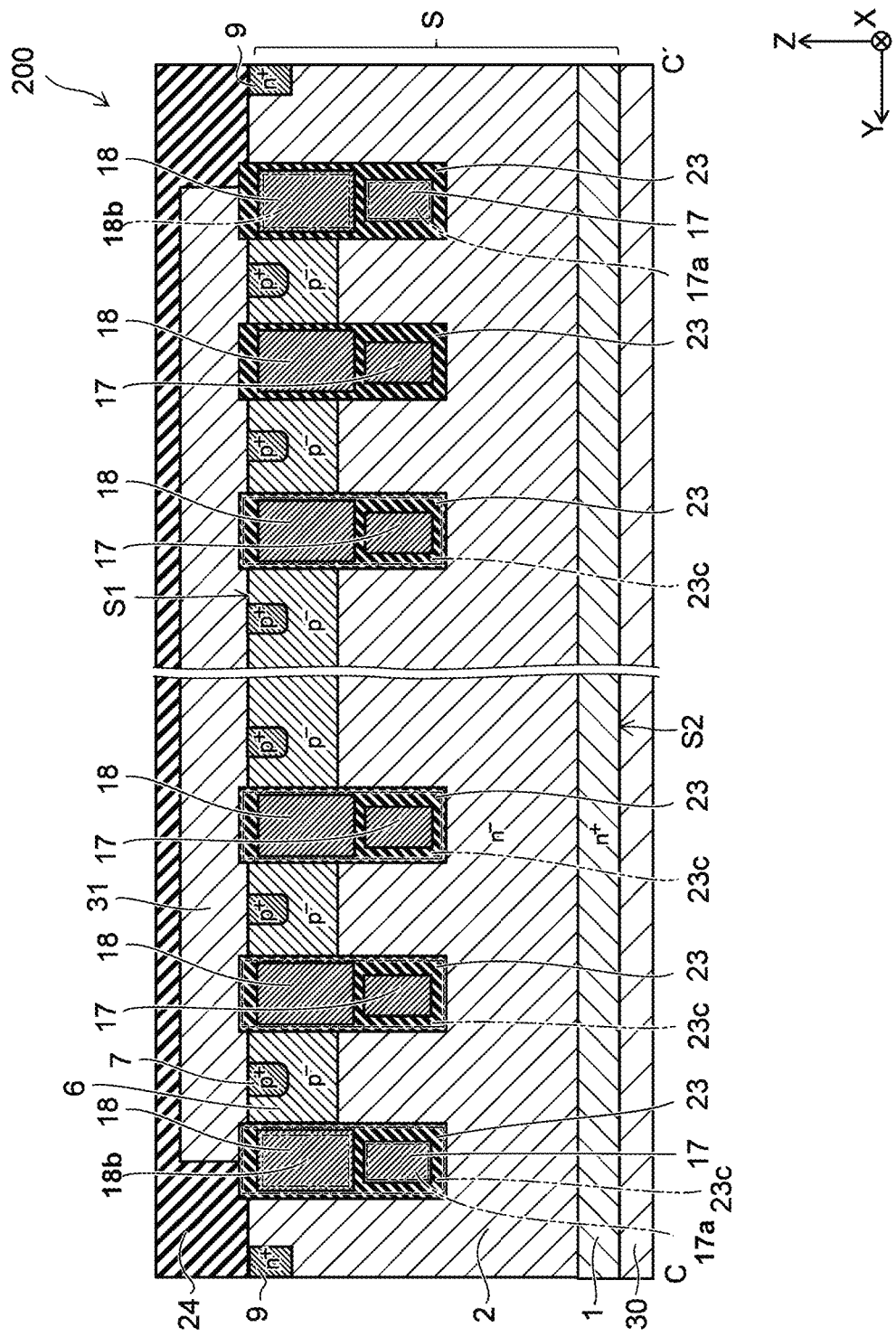
FIG. 17 is a cross-sectional view of the semiconductor device according to a second embodiment taken long line C-C' of FIG. 14.

FIG. 15 is an A-A' cross-sectional view of FIG. 14.
FIG. 16 is a B-B' cross-sectional view of FIG. 14.
FIG. 17 is a C-C' cross-sectional view of FIG. 14.

Only the first insulation portion 21, the second insulation portion 22, and the third insulation portion 23 provided in the semiconductor layer S are shown in FIG. 14, and the other components are omitted for purposes of explanation.

The semiconductor device 200 differs from the semiconductor device 100 in the electrodes respectively surrounded by each of the first insulation portion 21 to the third insulation portion 23. Other than this difference, the semiconductor device 200 may adopt the same structure as in the semiconductor device 100.

As shown in FIG. 14, the semiconductor device 200 includes the first insulation portion 21, the second insulation portion 22, and the third insulation portion 23 in the same manner as the semiconductor device 100.

As shown in FIG. 15, the semiconductor device 200 includes FP electrode 12 and FP electrode 13, both of which are surrounded by the first insulation portion 21. Gate electrode 14 and FP electrode 15 are both surrounded by the second insulation portion 22. FP electrode 17 and FP electrode 18 are both surrounded by the third insulation portion 23. Here, the FP electrodes 12, 13, 17, and 18 are electrically connected to the source electrode 31.

The FP electrode 12 includes the first electrode portion 12a and the second electrode portion 12b.

The FP electrode 13 includes a fifth electrode portion 13e and a sixth electrode portion 13f.

The FP electrode 12 is provided between the FP electrode 13 and the n⁻-type semiconductor region 2 in the Z direction. A plurality of the first electrode portions 12a and a plurality of the fifth electrode portions 13e are provided spaced from each other in the Y direction. Each of the first electrode portions 12a and each of the fifth electrode portions 13e extend in the X direction. The second electrode portion 12b and the sixth electrode portion 13f extend along the second insulation portion 21b in the Y direction. The first electrode portion 12a is in contact with the second electrode portion 12b, and the fifth electrode portion 13e is in contact with the sixth electrode portion 13f.

The gate electrode 14 faces a portion of the n⁻-type semiconductor region 2, the p-type base region 3, and at least one portion of the n⁺-type source region 4 through the second insulation portion 22 in the X direction. At least one portion of the FP electrode 15 faces a portion of the n⁻-type semiconductor region 2 through the second insulation portion 22 in the X direction. In addition, at least one portion of the FP electrode 15 overlaps with at least one portion of the gate electrode 14 through the second insulation portion 22 in the Z direction. The second electrode portion 12b is provided between a plurality of first electrode portions 12a and the FP electrode 15 in the X direction.

As depicted in FIG. 15, the FP electrode 17 includes the third electrode portion 17a and the fourth electrode portion 17b. The FP electrode 18 includes a seventh electrode portion 18b and an eighth electrode portion 18a. The FP electrode 17 is provided between the FP electrode 18 and the n⁻-type semiconductor region 2 in the Z direction. A plurality of the third electrode portions 17a are provided spaced from each other in the Y direction. A plurality of the seventh electrode portions 18b are also provided spaced from each in the Y direction. Each of the third electrode portions 17a and each of the seventh electrode portions 18b extend in the X direction. The fourth electrode portion 17b and the eighth electrode portion 18a extend along the fourth insulation portion 23d in the Y direction. The third electrode portion 17a is in contact with the fourth electrode portion 17b, and the seventh electrode portion 18b is in contact with the eighth electrode portion 18a.

The FP electrode 17 faces a portion of the $n^-$-type semiconductor region 2 through the third insulation portion 23 in the X direction and the Y direction. The FP electrode 18 faces a portion of the $n^-$-type semiconductor region 2, the p-type base region 3, and at least one portion of the $n^+$-type source region 4 through the third insulation portion 23 in the X direction. The third insulation portion 23 is provided between the FP electrode 17 and the FP electrode 18 and between the FP electrodes 17 and 18 and each of the $n^-$-type semiconductor region 2, the p-type base region 3, and the $n^+$-type source region 4.

In some embodiments, in the region surrounded by the first insulation portion 21, only the FP electrode 12 is provided without the FP electrode 13 being provided. In the same manner, in some embodiments only the FP electrode 17 may is provided without the FP electrode 18 being provided in the region surrounded by the third insulation portion 23.

As shown in FIG. 16, a position along the X direction of at least one portion of the $p^-$-type semiconductor region 6 is overlapping with at least one portion of the first electrode portion 12a along the X direction. A position of the $p^-$-type semiconductor region 6 in the Y direction is between two adjacent first electrode portions 12a. At least one portion of the $p^-$-type semiconductor region 6 and at least one portion of the $p^+$-type semiconductor region 7 are provided between adjacent fifth electrode portions 13e.

As shown in FIG. 17, a position of at least one portion of the $p^-$-type semiconductor region 6 in the X direction is equal to a position of at least one portion of the third electrode portion 17a in the X direction. A position of the $p^-$-type semiconductor region 6 in the Y direction is between positions of two adjacent third electrode portions 17a in the Y direction. At least one portion of the $p^-$-type semiconductor region 6 and at least one portion of the $p^+$-type semiconductor region 7 are provided between adjacent seventh electrode portions 18b.

In the second embodiment, it is possible to reduce a possibility of having a breakdown of a semiconductor device in a reverse recovery state while a breakdown voltage is maintained in the same manner as in the first embodiment.

In each example embodiment described above, a relative level of impurity concentration between semiconductor regions may be confirmed using, for example, scanning capacitance microscope (SCM). A carrier concentration in each semiconductor region may be regarded to be equal to an impurity concentration activated in each semiconductor region. Accordingly, even a relative level of carrier concentration between semiconductor regions may be confirmed using the SCM.

In addition, an impurity concentration in each semiconductor region may be measured by, for example, a secondary ion mass spectrometry (SIMS).

However, the above embodiments are only presented as examples and are not intended to limit a scope of the present disclosure. The aspects of these embodiments described herein may be embodied in other various forms, and various omission, substitutions, changes, and the like may be performed without departing from the scope of the present disclosure. With respect to a specific configuration of each element such as $n^+$-type drain region, an $n^-$-type semiconductor region, a p-type base region, an $n^+$-type source region, a $p^+$-type contact region, a gate electrode, a drain electrode, and a source electrode, which are included in an embodiment, those skilled in the art may appropriately select from known technologies. These embodiments and the modification example fall within the scope and spirit of the present disclosure, and are included in a scope of the present disclosure and its equivalents as set forth in the appended claims. Moreover, each embodiment described above may be implemented in combination with one another.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first semiconductor region of a first conductivity type;
   a first electrode extending in a first direction;
   a second electrode spaced from the first electrode and including:
      a plurality of first portions spaced from each other along the first direction, each first portion extending in a second direction intersecting the first direction, and
      a second portion extending in the first direction between the plurality of first portions, the second portion being between the plurality of first portions and the first electrode in the second direction;
   a third electrode spaced from the first electrode and the second electrode in the second direction;
   a first insulation region between the first semiconductor region and the second electrode;
   a second insulation region between the first semiconductor region and the first electrode and between the first semiconductor region and the third electrode;
   a second semiconductor region of a second conductivity type on the first semiconductor region and adjacent to the third electrode through the second insulation region;
   a third semiconductor region of the first conductivity type on the second semiconductor region;
   a fourth semiconductor region of the second conductivity type on the first semiconductor region and between, in the first direction, adjacent first portions of the second electrode; and
   a fourth electrode on the third semiconductor region and electrically connected to the second semiconductor region, the third semiconductor region, the fourth semiconductor region, the first electrode, and the second electrode.

2. The semiconductor device according to claim 1, wherein the first insulation region includes:
   a plurality of first portions spaced from each other along the first direction, each first portion extending in the second direction, and a second portion extending in the first direction and between the second insulation region and the plurality of first portions of the first insulation region in the second direction,
the first portions of the second electrode being in the plurality of first portions of the first insulation region, and
the second portion of the second electrode is in the second portion of the first insulation region.

3. The semiconductor device according to claim 2, wherein the fourth semiconductor region is between adjacent first portions of the first insulating region in the first direction.

4. The semiconductor device according to claim 1, further comprising:
a plurality of fifth semiconductor regions of the second conductivity type on the first semiconductor region, wherein
a carrier concentration in the plurality of fifth semiconductor regions is lower than a carrier concentration in the second semiconductor region, and
the second semiconductor region is between adjacent fifth semiconductor regions in the first direction.

5. The semiconductor device according to claim 4, wherein a carrier concentration in the fourth semiconductor region is equal to a carrier concentration in the plurality of fifth semiconductor regions.

6. The semiconductor device according to claim 1, further comprising:
a sixth semiconductor region of the first conductivity type on the first semiconductor region and surrounding the second semiconductor region, the third semiconductor region, and the fourth semiconductor region in a plane parallel to the first and second directions, wherein
a carrier concentration in the sixth semiconductor region is higher than a carrier concentration in the first semiconductor region.

7. The semiconductor device according to claim 1, wherein a distance between adjacent first portions of the second electrode in the first direction is equal to a distance between the first electrode and the second electrode in the second direction.

8. The semiconductor device according to claim 1, further comprising:
a seventh semiconductor region of the second conductivity type on the second semiconductor region, and
an eighth semiconductor region of the second conductivity type on the fourth semiconductor region, wherein
a carrier concentration in the seventh semiconductor region is higher than a carrier concentration in the second semiconductor region, and
a carrier concentration in the eighth semiconductor region is higher than a carrier concentration in the fourth semiconductor region.

9. The semiconductor device according to claim 8, further comprising:
a fifth electrode spaced from the second electrode and between the second semiconductor region and the second electrode in the second direction, wherein
a portion of the first insulation region is between the second semiconductor region and the fifth electrode.

10. The semiconductor device according to claim 1, further comprising:
a sixth electrode spaced from the first and second electrode and electrically connected to the fourth electrode, the sixth electrode including:

a plurality of third portions spaced from each other along the first direction, each third portion extending in the second direction, and
a fourth portion extending in the first direction between the plurality of third portions, the fourth portion being between the plurality of third portion and the first electrode in the second direction; and
a third insulation region between the first semiconductor region and the sixth electrode, wherein
the second insulation region is between the first insulation region and the third insulation region in the second direction.

11. The semiconductor device according to claim 10, wherein
a plurality of second insulation regions, a plurality of first electrodes, a plurality of third electrodes, a plurality of second semiconductor regions, and a plurality of third semiconductor regions are between the second and sixth electrodes in the second direction,
each of the plurality of first electrodes and each of the plurality of third electrodes being in one of the plurality of the second insulation regions, and
the plurality of second insulation regions are between the first insulation region and the third insulation region.

12. A semiconductor device, comprising:
a first semiconductor region of a first conductivity type;
a first electrode extending in a first direction;
a second electrode spaced from the first electrode and including:
a plurality of first portions spaced from each other along the first direction and extending in a second direction intersecting the first direction, and
a second portion extending in the first direction between the plurality of first portions, the second portion being between the plurality of first portions and the first electrode in the second direction;
a third electrode spaced from the first electrode and the second electrode;
a first insulation region between the first semiconductor region and the second electrode;
a second insulation region between the first semiconductor region and the first electrode and between the first semiconductor region and the third electrode;
a second semiconductor region of a second conductivity type on the first semiconductor region and adjacent to the third electrode via the second insulation region;
a third semiconductor region of the first conductivity type on the second semiconductor region;
a fourth semiconductor region of the second conductivity type on the first semiconductor region, the first insulation region being between the fourth semiconductor region and the second semiconductor region in the second direction, and between adjacent first portions of the second electrode in the first direction; and
a fourth electrode on the third semiconductor region and electrically connected to the second semiconductor region, the third semiconductor region, the fourth semiconductor region, the first electrode, and the second electrode.

13. The semiconductor device according to claim 12, further comprising:
a fifth semiconductor region of the second conductivity type on the second semiconductor region, and
an sixth semiconductor region of the second conductivity type on the fourth semiconductor region, wherein a carrier concentration in the fifth semiconductor region is higher than a carrier concentration in the second semiconductor region, and a carrier concentration in the sixth semiconductor region is higher than a carrier concentration in the fourth semiconductor region.

14. The semiconductor device according to claim 12, further comprising:

a fifth electrode on the first semiconductor region, the first semiconductor region being between the fourth electrode and the fifth electrode; and a sixth electrode between the third electrode and the fifth electrode.

15. The semiconductor device according to claim 12, wherein the semiconductor device is a vertical gate metal-oxide-semiconductor field-effect transistor device.

16. A semiconductor device, comprising:

a first semiconductor region of a first conductivity type;

a first electrode extending in a first direction;

a second electrode spaced from the first electrode and including:

a plurality of first portions spaced from each other along the first direction, each first portion extending in a second direction intersecting the first direction, and a second portion extending in the first direction between the plurality of first portions, the second portion being between the plurality of first portions and the first electrode in the second direction;

a first insulation region between the first semiconductor region and the second electrode;

a second insulation region between the first semiconductor region and the first electrode;

a second semiconductor region of a second conductivity type on the first semiconductor region and adjacent to the first electrode through the second insulation region;

a third semiconductor region of the first conductivity type on the second semiconductor region; and a third electrode on the third semiconductor region and electrically connected to the second semiconductor region, the third semiconductor region, and the second electrode.

17. The semiconductor device according to claim 16, further comprising:

a fourth semiconductor region of the second conductivity type on the first semiconductor region, the fourth semiconductor region being electrically connected to the third electrode and between adjacent pairs of first portions in the first direction.

18. The semiconductor device according to 16, wherein the plurality of first portions directly contact the second portion.

19. The semiconductor device according to 16, wherein a width of each first portion in the first direction is less than a width of each first portion in the second direction.

* * * * *